United States Patent
Iizuka et al.

(10) Patent No.: US 9,379,083 B2
(45) Date of Patent: Jun. 28, 2016

(54) SEMICONDUCTOR DEVICE AND METHOD FOR MANUFACTURING SEMICONDUCTOR DEVICE

(71) Applicant: FUJI ELECTRIC CO., LTD., Kawasaki-shi (JP)

(72) Inventors: Yuji Iizuka, Matsumoto (JP); Masafumi Horio, Matsumoto (JP); Hideyo Nakamura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/455,184

(22) Filed: Aug. 8, 2014

(65) Prior Publication Data

US 2014/0367736 A1    Dec. 18, 2014

Related U.S. Application Data

(63) Continuation of application No. PCT/JP2013/056634, filed on Mar. 11, 2013.

(30) Foreign Application Priority Data

Mar. 28, 2012    (JP) .................................. 2012-072673

(51) Int. Cl.
*H01L 23/00*    (2006.01)
*H01L 25/18*    (2006.01)
(Continued)

(52) U.S. Cl.
CPC .............. *H01L 24/80* (2013.01); *H01L 23/051* (2013.01); *H01L 23/3107* (2013.01);
(Continued)

(58) Field of Classification Search
CPC ......... H01L 24/02; H01L 24/80; H01L 23/34; H01L 25/18
USPC ......................................................... 257/133
See application file for complete search history.

(56) References Cited

U.S. PATENT DOCUMENTS

| 4,729,744 A |   | 3/1988 | Bet et al. |
|---|---|---|---|
| 5,202,578 A | * | 4/1993 | Hideshima .............. H01L 25/11 257/678 |

(Continued)

FOREIGN PATENT DOCUMENTS

| EP | 2284889 A1 | 2/2011 |
|---|---|---|
| JP | 6286900 A | 4/1987 |

(Continued)

OTHER PUBLICATIONS

International Search Report issued in PCT/JP2013/056634 dated Jun. 11, 2013.

(Continued)

*Primary Examiner* — Christine Enad
(74) *Attorney, Agent, or Firm* — Rossi, Kimms & McDowell LLP

(57) ABSTRACT

A semiconductor device is a composite module in which three power semiconductor modules are arranged at a predetermined interval in the same plane and pin-shaped conductors that are drawn from the power semiconductor modules to the outside are connected to three main terminal plates such that they are integrated with each other. When the entire composite module is accommodated in a protective case and a radiation fin is provided, bolts are inserted into through holes to fix the protective case to the radiation fin. In this way, it is possible to accommodate the composite module in the protective case while reliably bringing the bottom of an insulating substrate into close contact with the radiation fin.

13 Claims, 19 Drawing Sheets

(51) Int. Cl.
| | | |
|---|---|---|
| *H05K 1/02* | (2006.01) | |
| *H02M 7/00* | (2006.01) | |
| *H01L 25/07* | (2006.01) | |
| *H01L 23/31* | (2006.01) | |
| *H01L 23/34* | (2006.01) | |
| *H01L 29/66* | (2006.01) | |
| *H01L 23/498* | (2006.01) | |
| *H01L 23/051* | (2006.01) | |
| *H01L 25/11* | (2006.01) | |
| *H01L 23/538* | (2006.01) | |

(52) U.S. Cl.
CPC ......... *H01L 23/34* (2013.01); *H01L 23/49811* (2013.01); *H01L 24/02* (2013.01); *H01L 25/072* (2013.01); *H01L 25/117* (2013.01); *H01L 25/18* (2013.01); *H01L 29/66325* (2013.01); *H02M 7/003* (2013.01); *H05K 1/0263* (2013.01); *H01L 23/5385* (2013.01); *H01L 2224/06* (2013.01); *H01L 2224/45124* (2013.01); *H01L 2224/48091* (2013.01); *H01L 2224/48227* (2013.01); *H01L 2924/0105* (2013.01); *H01L 2924/01028* (2013.01); *H01L 2924/01082* (2013.01); *H01L 2924/01322* (2013.01); *H01L 2924/12032* (2013.01); *H01L 2924/12042* (2013.01); *H01L 2924/1305* (2013.01); *H01L 2924/13055* (2013.01); *H01L 2924/13091* (2013.01); *H01L 2924/15787* (2013.01); *H01L 2924/181* (2013.01); *H05K 2201/10166* (2013.01)

(56) References Cited

U.S. PATENT DOCUMENTS

| | | | |
|---|---|---|---|
| 5,408,128 | A | 4/1995 | Furnival |
| 5,927,504 | A | 7/1999 | Han et al. |
| 8,526,199 | B2 | 9/2013 | Matsumoto et al. |
| 2004/0248330 | A1 | 12/2004 | Kitabatake et al. |
| 2005/0093137 | A1 | 5/2005 | Ishikawa et al. |
| 2007/0183130 | A1 | 8/2007 | Yamabuchi et al. |
| 2007/0242584 | A1 | 10/2007 | Chan |
| 2008/0284007 | A1 | 11/2008 | Horio et al. |
| 2008/0290506 | A1 | 11/2008 | Aoki et al. |
| 2010/0039843 | A1 | 2/2010 | Takizawa |
| 2010/0127371 | A1* | 5/2010 | Tschirbs ............... H01L 23/13 257/684 |
| 2010/0128441 | A1 | 5/2010 | Soda et al. |
| 2010/0149774 | A1 | 6/2010 | Matsumoto et al. |
| 2011/0203967 | A1 | 8/2011 | Starovecky |
| 2011/0273861 | A1 | 11/2011 | Matsumoto et al. |
| 2012/0008286 | A1 | 1/2012 | Suzuki |
| 2012/0241953 | A1 | 9/2012 | Yamada et al. |
| 2012/0256194 | A1 | 10/2012 | Yoshihara et al. |
| 2013/0062751 | A1 | 3/2013 | Takagi et al. |
| 2013/0154081 | A1 | 6/2013 | Kadoguchi et al. |
| 2014/0210067 | A1 | 7/2014 | Takamiya et al. |

FOREIGN PATENT DOCUMENTS

| | | | |
|---|---|---|---|
| JP | 04-133391 | A | 5/1992 |
| JP | 05094854 | A | 4/1993 |
| JP | 05-218252 | A | 8/1993 |
| JP | 06-013539 | A | 1/1994 |
| JP | 07-123738 | A | 5/1995 |
| JP | 07240497 | A | 9/1995 |
| JP | 10093016 | A | 4/1998 |
| JP | 2001036005 | A | 2/2001 |
| JP | 3430192 | B2 | 7/2003 |
| JP | 2003289130 | A | 10/2003 |
| JP | 2004-289103 | A | 10/2004 |
| JP | 2005065414 | A | 3/2005 |
| JP | 2006-081308 | A | 3/2006 |
| JP | 2006081312 | A | 3/2006 |
| JP | 2006332291 | A | 12/2006 |
| JP | 2007-194442 | A | 8/2007 |
| JP | 2007-209184 | A | 8/2007 |
| JP | 4129027 | B2 | 7/2008 |
| JP | 2008-193779 | A | 8/2008 |
| JP | 2008294069 | A | 12/2008 |
| JP | 2010-103343 | A | 5/2010 |
| JP | 2010103222 | A | 5/2010 |
| JP | 2010245096 | A | 10/2010 |
| JP | 2010-251772 | A | 11/2010 |
| JP | 2011233606 | A | 11/2011 |
| WO | 2008/142758 | A1 | 11/2008 |
| WO | 2011083737 | A1 | 7/2011 |
| WO | 2012029164 | A1 | 3/2012 |

OTHER PUBLICATIONS

Office Action issued in JP2014-507624, mailed Dec. 1, 2015. English translation provided.
Extended European Search Report issued in EP137703542, mailed Dec. 16, 2015.
Extended European Search Report issued in EP13769080.6, mailed Dec. 17, 2015.
Office Action issued in U.S. Appl. No. 14/455,129, mailed Jan. 29, 2016.
Extended European Search Report issued in EP13770136.3, mailed Nov. 10, 2015.
International Search Report issued in PCT/JP2013/001805, mailed May 21, 2013.
Office Action issued in U.S. Appl. No. 14/455,098, mailed Jul. 31, 2015.
International Search Report issued in PCT/JP2013/001804, mailed May 21, 2013.
Office Action issued in U.S. Appl. No. 14/455,129, mailed Aug. 5, 2015.

* cited by examiner

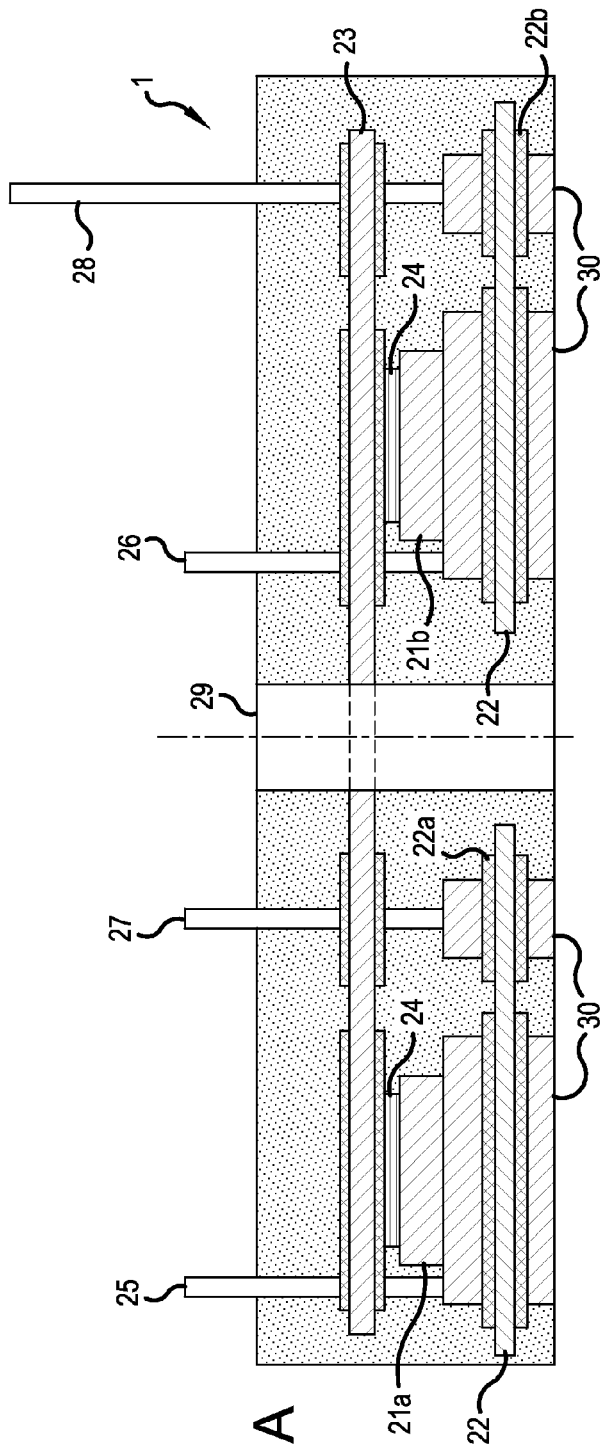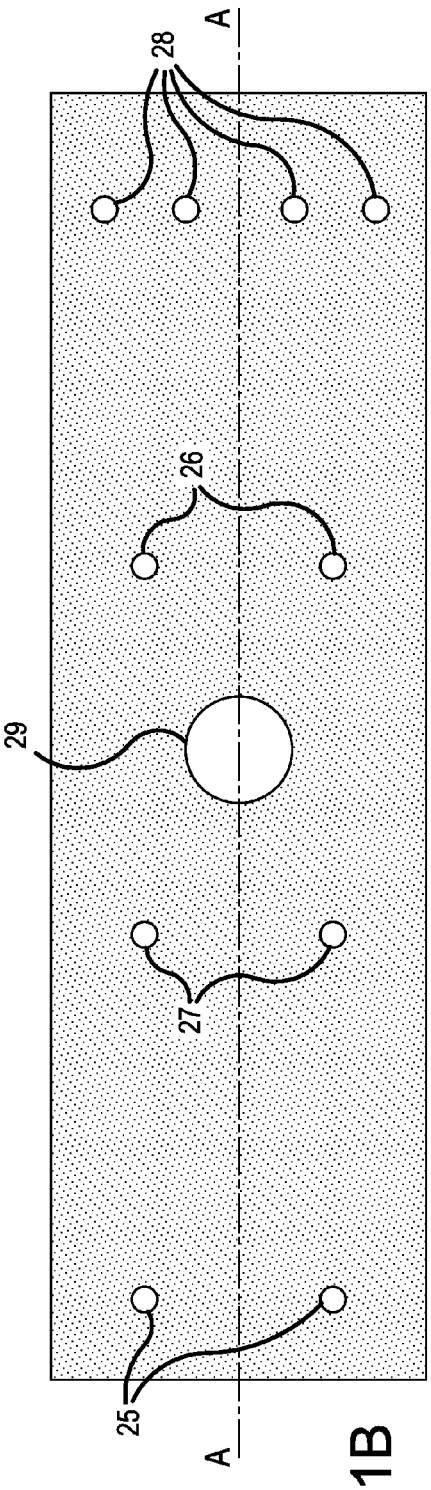
FIG.1A
FIG.1B

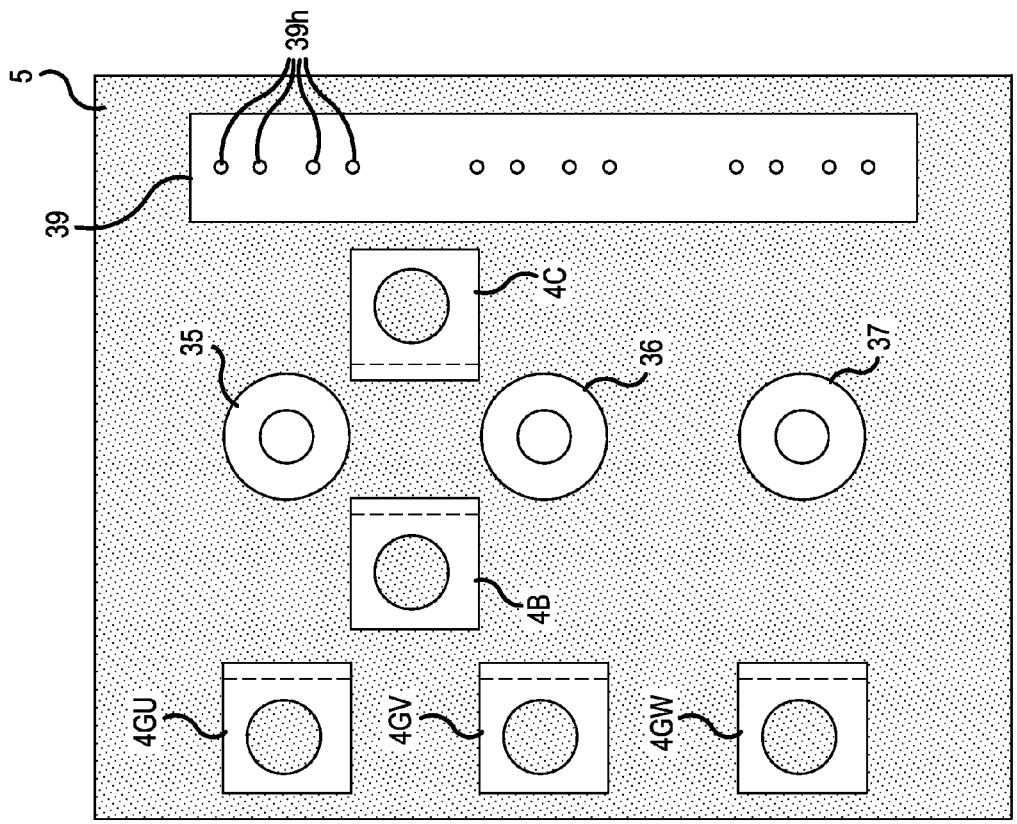
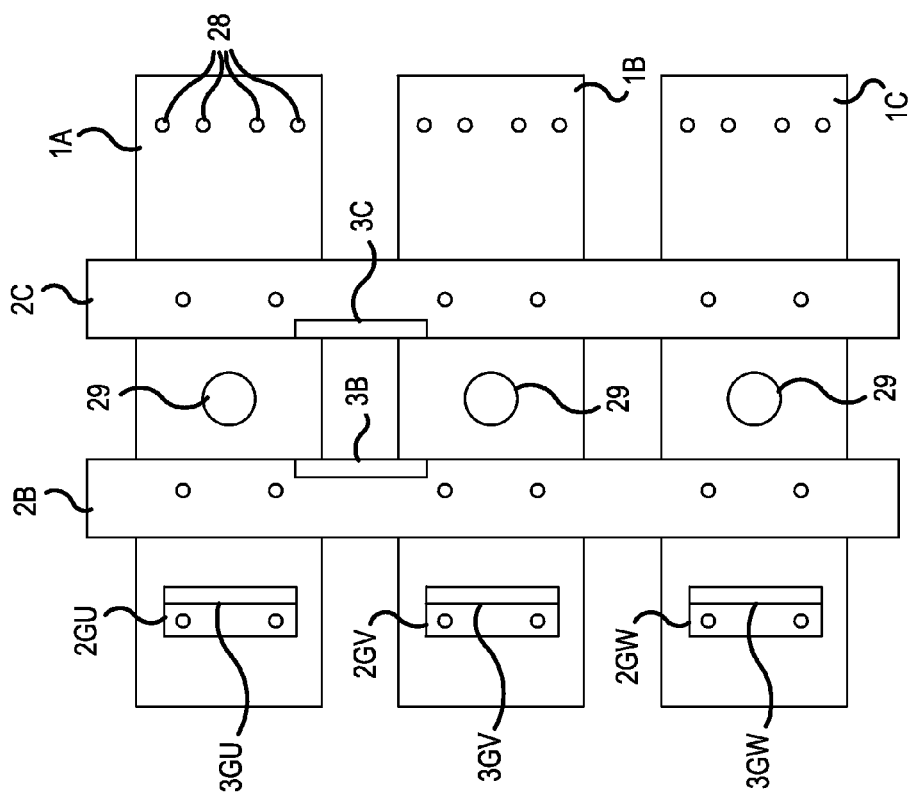
FIG.10A
FIG.10B

SEMICONDUCTOR DEVICE AND METHOD FOR MANUFACTURING SEMICONDUCTOR DEVICE

CROSS REFERENCE TO RELATED APPLICATIONS

This application is a continuation of International Application No. PCT/JP2013/056634, filed on Mar. 11, 2013, which is based on and claims priority to Japanese Patent Application No. JP 2012-072673, filed on Mar. 28, 2012. The disclosure of the Japanese priority application and the PCT application in their entirety, including the drawings, claims, and the specification thereof, are incorporated herein by reference.

BACKGROUND

1. Field of the Invention

Embodiments of the present invention relate to a semiconductor device that includes a semiconductor module including, for example, a power device and has a common external connection structure and a method for manufacturing a semiconductor device.

2. Discussion of the Background

A power inverter device has been widely used as one of power conversion devices. For example, a motor is generally used as a driving source of an electric vehicle and the inverter device is generally used to control this type of motor.

A semiconductor module including a power device, such as an insulated gate bipolar transistor (IGBT) or a free wheeling diode (FWD), is used in the power conversion device.

FIG. 19 is a cross-sectional view illustrating an example of a semiconductor module according to the related art. In the semiconductor module according to the related art illustrated in FIG. 19, a semiconductor chip 11, such as an IGBT or an FWD, is bonded to an insulating substrate 12. The insulating substrate 12 is, for example, a ceramic substrate and conductor layers 12a and 12b are formed on the front and rear surfaces of the insulating substrate 12, respectively. The semiconductor chip is bonded to the conductor layer 12a on the front surface which is a first main surface. In addition, the conductor layer 12b on the rear surface, which is a second main surface of the insulating substrate 12, is bonded to a base plate 13 made of a material with high thermal conductivity. A surface of the base plate 13 that is opposite to the surface to which the insulating substrate 12 is bonded is fixed to the radiation fin 14, with a compound or a sheet with high thermal conductivity interposed therebetween.

On the front surface side of the insulating substrate 12, the conductor layer 12a forms a circuit pattern, is bonded to an electrode on the rear surface of the semiconductor chip 11, and is generally bonded to an electrode on the front surface of the semiconductor chip 11 by an aluminum wire 15. In addition, a plurality of external terminals 16a to 16c are connected to the conductor layer 12a on the insulating substrate 12.

A frame-shaped resin case 17 is fixed to the base plate 13 by, for example, an adhesive so as to surround the insulating substrate 12. A sealing material 18, such as silicon gel, fills the resin case 17 and the base plate 13 so as to cover, for example, the semiconductor chip 11. Then, a cover 17a is fixed so as to close an opening of the resin case 17 and the semiconductor chip 11 or the internal wiring structure is protected by an external environment.

In recent years, with the spreading of renewable power generation facilities for reducing power consumption, there is an increasing demand for a power conversion semiconductor device. In particular, it is a challenge to increase capacity or a breakdown voltage in the above-mentioned semiconductor module.

That is, in the above-mentioned semiconductor device, a plurality of semiconductor chips 11 are arranged on the conductor layer 12a on the insulating substrate 12 and the semiconductor chips 11 are connected to each other by the aluminum wire 15 to achieve a parallel or series connection structure. As a result, high capacity or a high breakdown voltage is obtained. In addition, a plurality of insulating substrates 12 are mounted on the base plate 13 and the conductor layers 12a on the insulating substrates 12 and the semiconductor chips 11 are connected to each other by the aluminum wires 15. In this way, a parallel or series circuit structure is achieved and high capacity or a high breakdown voltage is obtained. The semiconductor module is a large semiconductor module which is formed as a circuit structure with desired capacity or breakdown voltage.

In order to transfer heat (loss) generated from the semiconductor chip 11 to the base plate 13 and to dissipate the heat to the outside of the system with high efficiency, the base plate 13 needs to be fixed to the radiation fin 14 by a plurality of bolts 19, and the base plate 13 and the radiation fin 14 need to be held while coming into pressure contact with each other (for example, see JP 2007-194442 A) ("Patent Document 1").

JP 2004-289103 A ("Patent Document 2") and JP 2010-251772 A ("Patent Document 3") disclose a semiconductor device which can ensure high yield using a wide band gap semiconductor in which yield is reduced due to crystal defects in a wafer and can be manufactured at a low cost. Here, in a semiconductor module, segments (semiconductor element) which can individually operate are provided on a silicon carbide (SiC) substrate and an element separation region, such as a trench or a Schottky diode, for electrically separating adjacent segments is provided. In the semiconductor module, only the electrode pad of the segment which has passed a test is connected to the electrode terminal.

JP 2007-209184 A ("Patent Document 4") discloses a power conversion device, which includes a bus bar that connects a power conversion circuit and an external device, and a base that fixes at least a power module and a control substrate. In the power conversion device, modules corresponding to one arm are fixed to a common base and are connected to each other by the bus bar. Here, the power conversion device has an optimum structure corresponding to an attachment space, which results in an increase in flexibility in the mounting of the power conversion device to, for example, the engine room of the vehicle with many spatial constraints. In addition, the rigidity of the control substrate increases and vibration resistance increases. Furthermore, it is possible to improve a cooling effect.

JP 2006-81308 A ("Patent Document 5") discloses a technique related to a power drive unit including a plurality of power modules. The power drive unit includes a radiator plate to which the plurality of power modules and a current detection unit are connected in parallel. In addition, the power drive unit includes insertion holes into which positioning pins provided in the power module and positioning pins formed on an electronic circuit board are inserted. Here, it is possible to connect one electronic circuit board and a plurality of power modules once (at the same time) and to easily assemble them. Therefore, the efficiency of an assembly operation is improved.

JP 05-218252 A ("Patent Document 6") and JP 07-123738 A ("Patent Document 7") disclose a structure in which the external terminals of modules are connected by a connection conductor such as a bus bar.

For example, it is necessary to form a full-bridge circuit using the semiconductor device illustrated in FIG. 19 as follows. That is, in the semiconductor device illustrated in FIG. 19, the external terminals 16a to 16c exposed from the cover 17a are connected by a wiring substrate which is provided outside the semiconductor device or an external connection conductor, such as a bus bar, and the individual semiconductor devices are wired to form external lead terminals for output and input power sources (for example, see Patent Document 6).

However, in the semiconductor device with a single module, the number of insulating substrates 12 or the internal arrangement of the external terminals 16a to 16c is determined by the internal structure of the semiconductor device depending on the usage of the semiconductor device, and there are restrictions in the outward shape of the external connection conductor or the entire semiconductor device in the external structure of the semiconductor device. Therefore, various types of semiconductor chips 11, insulating substrates 12, external terminals 16a to 16c, resin cases 17, and covers 17a corresponding to current capacities required for each rating level need to be prepared in order to satisfy types for each rating level. As a result, production efficiency is reduced.

SUMMARY

Embodiments of the invention provide a semiconductor device and a semiconductor device manufacturing method which can perform modularization depending on current rating to improve production efficiency.

According to an aspect of the invention, there is provided a semiconductor device including: a semiconductor module including a circuit board and at least one semiconductor circuit which is mounted on the circuit board; a main terminal plate that electrically connects terminals which are drawn from the semiconductor circuits of at least two semiconductor modules to the outside of the semiconductor modules and includes a connection terminal portion which is connected to an external wiring line; and a protective case that accommodates a composite module obtained by connecting the terminals using the main terminal plate to integrate the at least two semiconductor modules and has an insertion hole through which the connection terminal portion is drawn to the outside of the composite module.

According to another aspect of the invention, there is provided a method for manufacturing a semiconductor device including: locally radiating a laser beam to surfaces of terminals that are drawn from semiconductor circuits of at least two semiconductor modules to the outside of the semiconductor modules, each of which includes a circuit board and at least one semiconductor circuit mounted on the circuit board, to heat the surfaces; bonding the heated and melted terminals and a main terminal plate common to the at least two semiconductor modules; and forming a conduction path between the at least two semiconductor modules.

According to embodiments of the invention, it is possible to provide a semiconductor device and a semiconductor device manufacturing method which can perform modularization depending on current rating to improve production efficiency.

BRIEF DESCRIPTION OF DRAWINGS

FIG. 1A is a cross-sectional view and FIG. 1B is a plan view illustrating a power semiconductor module according to a first embodiment.

FIG. 4A is a plan view illustrating a state before main terminals are formed and FIG. 4B is a plan view illustrating a state after the main terminals are formed.

FIGS. 10A and 10B are diagrams illustrating a composite module according to a third embodiment. FIG. 10A is a diagram illustrating semiconductor modules before they are accommodated in a protective case and FIG. 10B is a diagram illustrating a state in which main terminal segments are bent above the surface of the protective case.

FIG. 12A a diagram illustrating the semiconductor modules before they are accommodated in a protective case and FIG. 12B is a diagram illustrating a state in which main terminal segments are bent above the surface of the protective case.

DESCRIPTION OF ILLUSTRATED EMBODIMENTS

Embodiments of the invention will be described with reference to the drawings.

Embodiment 1

Figure 2:
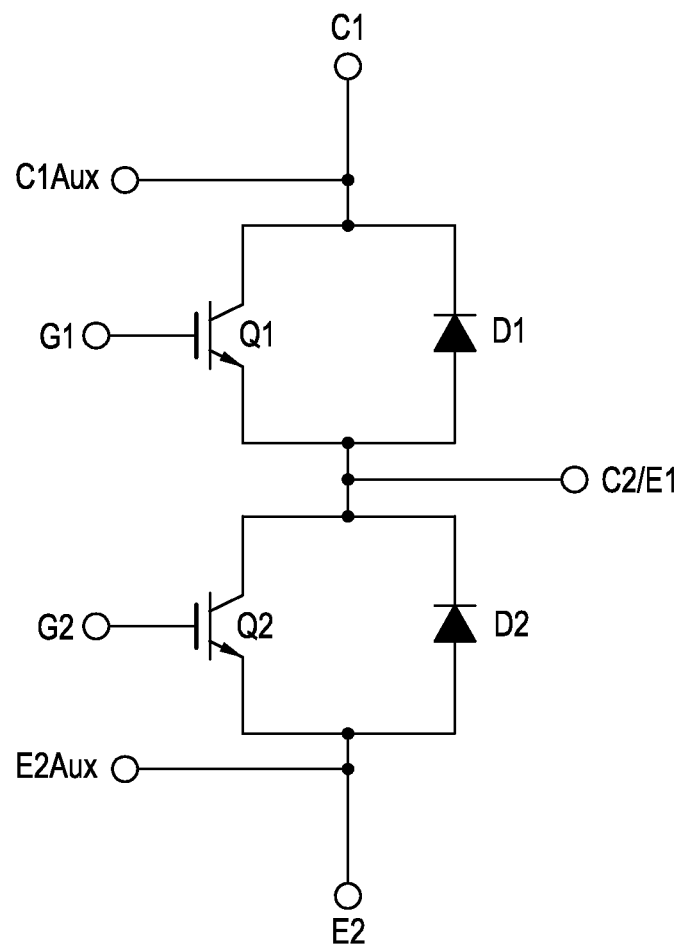
FIG. 2 is an equivalent circuit diagram illustrating a semiconductor circuit formed by the power semiconductor module illustrated in FIG. 1.

FIG. 1A is a cross-sectional view and FIG. 1B is a plan view illustrating a power semiconductor module according to a first embodiment of the invention. FIG. 2 is an equivalent circuit diagram illustrating a semiconductor circuit formed by the power semiconductor module illustrated in FIG. 1.

A power semiconductor module 1 includes two semiconductor circuits formed by mounting semiconductor chips 21a and 21b on insulating substrates 22 and a wiring substrate 23, which forms a common wiring circuit above the semiconductor circuits. In the semiconductor circuits, each of the semiconductor chips 21a and 21b is formed by a power device, such as an IGBT, a power metal-oxide-semiconductor field-effect transistor (MOSFET), or an FWD. For ease of understanding of illustration, only one semiconductor chip 21a (21b) is mounted on one insulating substrate 22 in FIG. 1. In practice, a switching device, such as an IGBT, and an FWD are provided on a conductor layer on the front surface of one insulating substrate 22 and are connected as illustrated in the equivalent circuit of FIG. 2.

The semiconductor chips 21a and 21b are various types of power devices and may be formed on a silicon substrate or a SiC substrate.

The insulating substrate 22 is made of ceramics, such as alumina with high thermal conductivity, and copper films 22a and 22b, which form a conductor layer, are attached to the front and rear surfaces of the insulating substrate 22. A predetermined circuit pattern for connecting a plurality of power devices which are arranged on the conductor layer is formed on the conductor layer (copper film 22a) on the front surface.

As can be seen from the equivalent circuit diagram illustrated in FIG. 2, an inverse parallel circuit of a switching device (hereinafter, simply referred to as a transistor) Q1 and an FWD (hereinafter, referred to as a diode) D1 and an inverse parallel circuit of a transistor Q2 and a diode D2 are connected in series to the copper films 22a and 22b on the insulating substrates 22, respectively.

Here, the semiconductor chip (power device) arranged on one insulating substrate 22 may equivalently form the inverse parallel circuit of the transistor and the diode illustrated in FIG. 2. Therefore, the transistor and/or the diode may be provided with a plurality of semiconductor chips with the same rating.

FIG. 1 illustrates a state in which the semiconductor chip 21a forming the transistor Q1 and the semiconductor chip (not illustrated) which forms the diode D1 and is provided on the rear side of the semiconductor chip 21a are arranged in the front-rear direction on the copper film 22a on the insulating substrate 22. Similarly, the semiconductor chip 21b forming the transistor Q2 and the semiconductor chip which forms the diode D2 and is provided on the rear side of the semiconductor chip 21b are arranged in the front-rear direction on the copper film 22b on the insulating substrate 22. That is, the transistor Q1 and the diode D1 are connected in inverse parallel by the copper film 22a on the insulating substrate 22 and the wiring substrate 23, and the transistor Q2 and the diode D2 are connected in inverse parallel by the copper film 22b on the insulating substrate 22 and the wiring substrate 23. Two inverse parallel circuits formed by a pair of the transistor Q1 and the diode D1 and a pair of the transistor Q2 and the diode D2 are connected in series to each other by the wiring substrate 23, which is arranged on the upper surface, and a post-shaped electrode member 24.

In addition, the two semiconductor chips 21a may not be arranged in the front-rear direction on the copper film 22a on the insulating substrate 22 unlike FIG. 1, but may be arranged in a line in the left-right direction. Similarly, the semiconductor chips 21b may be arranged in a line in the left-right direction.

In this embodiment, a collector electrode of the transistor Q1 is formed on the lower surface of one semiconductor chip 21a and is connected to a pin-shaped conductor (pin terminal) 25 which forms an external input terminal (collector terminal C1) of the power semiconductor module 1 through the copper film 22a. A collector electrode of the transistor Q2 formed on the rear surface of the other semiconductor chip 21b is connected to a pin-shaped conductor (pin terminal) 26 which forms an external output terminal (collector/emitter terminal C2/E1) through the copper film 22a. The emitter electrodes and gate electrodes of the transistors Q1 and Q2 are formed on the front surfaces of the semiconductor chips 21a and 21b, respectively, and are connected to the wiring substrate 23 through the electrode members 24. Among the emitter electrodes and the gate electrodes, the emitter electrode of the transistor Q1 is connected to the pin terminal 26 through the wiring substrate 23 and the emitter electrode of the transistor Q2 is connected to a pin-shaped conductor (pin terminal) 27 which forms an external input terminal (emitter terminal E2) through the wiring substrate 23.

As illustrated in FIG. 1(B), two pin-shaped conductors 25, two pin-shaped conductors 26, and two pin-shaped conductors 27 are symmetrically formed with respect to the line A-A of the power semiconductor module 1. The power semiconductor module 1 further includes four pin-shaped conductors (pin terminals) 28 with the leading ends protruding from the pin-shaped conductors 25 to 27. Among the four pin-shaped conductors 28, two pin-shaped conductors 28 are connected to the wiring substrate 23 and form gate terminals G1 and G2 which supply gate control signals to the gate electrodes of the transistors Q1 and Q2 of a half-bridge circuit. The other two pin-shaped conductors 28 are control (auxiliary) terminals and form, for example, test terminals C1Aux and E2Aux which output sense signals for sensing a current that flows between the collector and emitter of the transistors Q1 and Q2.

Each component of the power semiconductor module 1 is molded by, for example, an epoxy resin material, which is a thermosetting resin, and is protected. As a result, the outward appearance of the power semiconductor module 1 is a rectangular parallelepiped which has a rectangular shape in a plan view as illustrated in FIGS. 1A and 1B. A cylindrical through hole 29 with a predetermined diameter is provided at the center of the power semiconductor module 1. The ends of ten pin-shaped conductors 25 to 28 protrude from the upper surface of the power semiconductor module 1. A plurality of copper plates 30 are provided on the bottom of the power semiconductor module 1 in correspondence with the copper films 22b on the bottoms of the insulating substrates 22 so as to be flush with each other. When a bolt is inserted into the through hole 29 from the front surface of the power semiconductor module 1 to fix a radiation fin to the bottom of the power semiconductor module 1, the copper plates 30 come into close contact with the radiation fin to form a radiating surface of the power semiconductor module 1.

Figure 19:
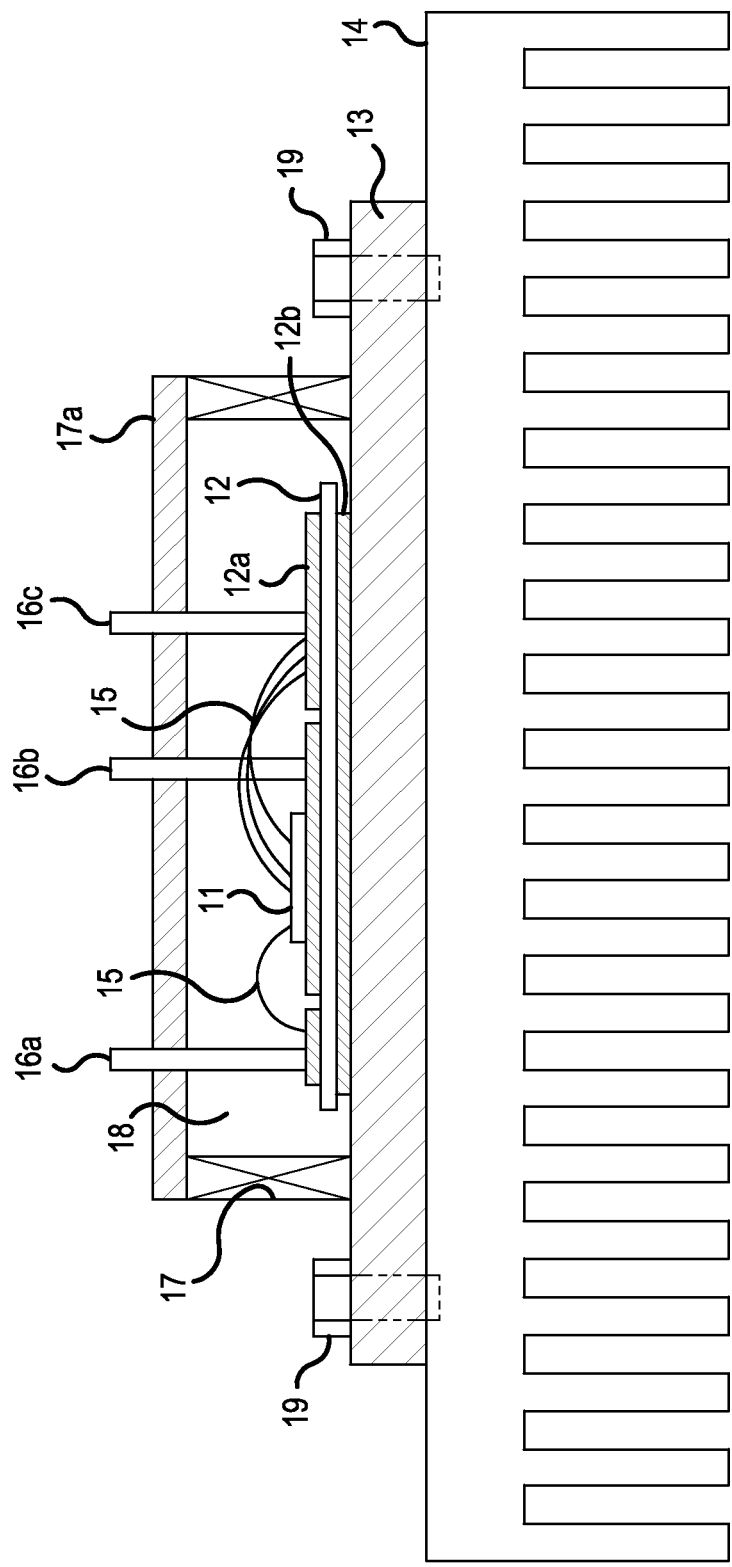
FIG. 19 is a cross-sectional view illustrating an example of a semiconductor module according to the related art.

The power semiconductor module 1 with a sealing structure using a resin material has the same function as the module according to the related art illustrated in FIG. 19. In addition, the power semiconductor module 1 forms a unit element of an integrated semiconductor device (composite module), which will be described below, and all of the semiconductor circuit components are individually protected by the sealing resin. Since the bolt is inserted into the through hole 29 to fix the power semiconductor module 1, it is possible to reliably bring the bottoms of the insulating substrates 22 into close contact with the radiation fin 14 illustrated in FIG. 19.

In the above-mentioned example, the collector terminal C1, the collector/emitter terminal C2/E1, and the emitter terminal E2 correspond to the pin-shaped conductors (pin terminals) 25 to 27, respectively. However, the invention is not limited thereto. The correspondence of the collector terminal C1, the collector/emitter terminal C2/E1, and the emitter terminal E2 to the pin-shaped conductors (pin terminals) 25 to 27 may vary depending on the copper films 22a and 22b on the insulating substrate 22 and the wiring of the wiring substrate 23.

Figure 3:
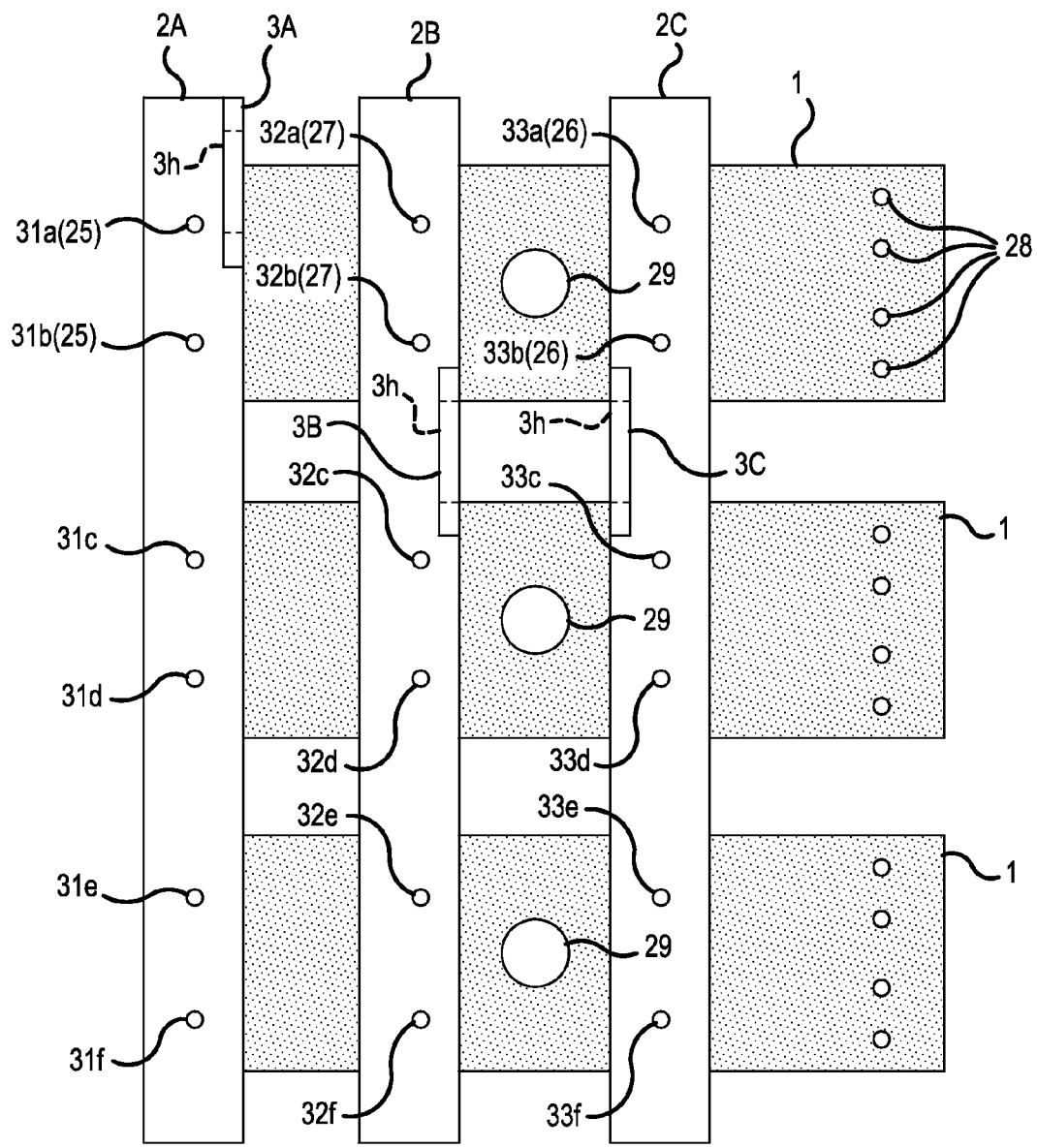
FIG. 3 is a plan view illustrating a composite module obtained by integrating the power semiconductor modules illustrated in FIG. 1.

Next, an example of a composite semiconductor device having the power semiconductor module 1 as a unit module will be described. FIG. 3 is a plan view illustrating a composite module of the power semiconductor modules illustrated in FIG. 1.

In the composite module illustrated in FIG. 3, three power semiconductor modules 1 are arranged in the same plane and the pin-shaped conductors 25 to 27 which are drawn from the power semiconductor module 1 to the outside are connected to three main terminal plates 2A to 2C. In this way, the power semiconductor modules are integrated with each other. Six through holes 31a to 31f into which the pin-shaped conductors 25 forming the external input terminals (collector terminals C1) of the three power semiconductor modules 1 are inserted are formed in the main terminal plate 2A. Six through holes 32a to 32f in which the pin-shaped conductors 27 forming the external output terminals (collector/emitter terminals C2/E1) of the three power semiconductor modules 1 are inserted are formed in the main terminal plate 2B. Six through holes 33a to 33f in which the pin-shaped conductors 26 forming the external input terminals (emitter terminals E2) of the three power semiconductor modules 1 are inserted are formed in the main terminal plate 2C.

Each of the main terminal plates 2A to 2C is a conductor which is arranged across each power semiconductor module 1 and connects the semiconductor circuits provided in the power semiconductor modules. The main terminal plates 2A to 2C include rising pieces 3A to 3C which are partially bent. The rising pieces 3A to 3C are formed with a predetermined length at predetermined positions so as to be drawn as external main terminal segments from a protective case 3 (see FIGS. 4 and 5 which will be described below), which will be described below. In addition, a round hole 3h (see FIG. 5 which will be described below) is provided in the vicinity of the leading end of each of the rising pieces 3A to 3C.

The pin-shaped conductors 25 to 27 of the power semiconductor modules 1 are inserted into the through holes 31a to 33f of the main terminal plates 2A to 2C. In this way, the main terminal plates 2A to 2C are bonded to each power semiconductor module 1 and a conduction path is formed between the semiconductor circuits in the three power semiconductor modules 1. The main terminal plates 2A to 2C and the pin-shaped conductors 25 to 27 are bonded to each other as follows. For example, when lead (Pb)-free solder including tin (Sn) is used, the main terminal plates 2A to 2C and the pin-shaped conductors 25 to 27 are assembled as illustrated in FIG. 3 and paste solder is applied to the pin-shaped conductors 25 to 27 and is then heated. In the bonding process, general flow solder may be used. In addition, when the following method is used, it is possible to achieve a strong bonding.

That is, the pin-shaped conductors 25 to 27 may be made of a copper (Cu) or aluminum (Al)-based material with high conductivity. When ease of soldering is considered, a nickel (Ni) or tin-based surface treatment is performed for the pin-shaped conductors 25 to 27 to improve soldering wettability. Therefore, it is possible to improve mounting efficiency.

In addition, an excited spot laser beam may be radiated to the individual pin terminals (pin-shaped conductors 25 to 27) of the power semiconductor modules 1 to locally heat the pin terminals, thereby bonding the external main terminal plates 2A to 2C. In this case, for example, a silver (Ag) or gold (Au)-based alloy material may be used in addition to the copper or aluminum-based material with high conductivity. When copper, aluminum, or silver is used, a local homogeneous diffusion bonding is achieved. However, when heat reception stability in a short time is considered, silver with high conductivity may be used. When gold is used, a tin film is coated on the surface of the pin terminal. In this case, the tin-gold-based bonding has a low melting point and bonding power is reduced, as compared to when copper, aluminum, or silver is used. In addition, after solidification, a eutectic component of tin and gold forms a bonding portion. Therefore, higher heat resistance than that in general soldering is expected.

Figure 4B:
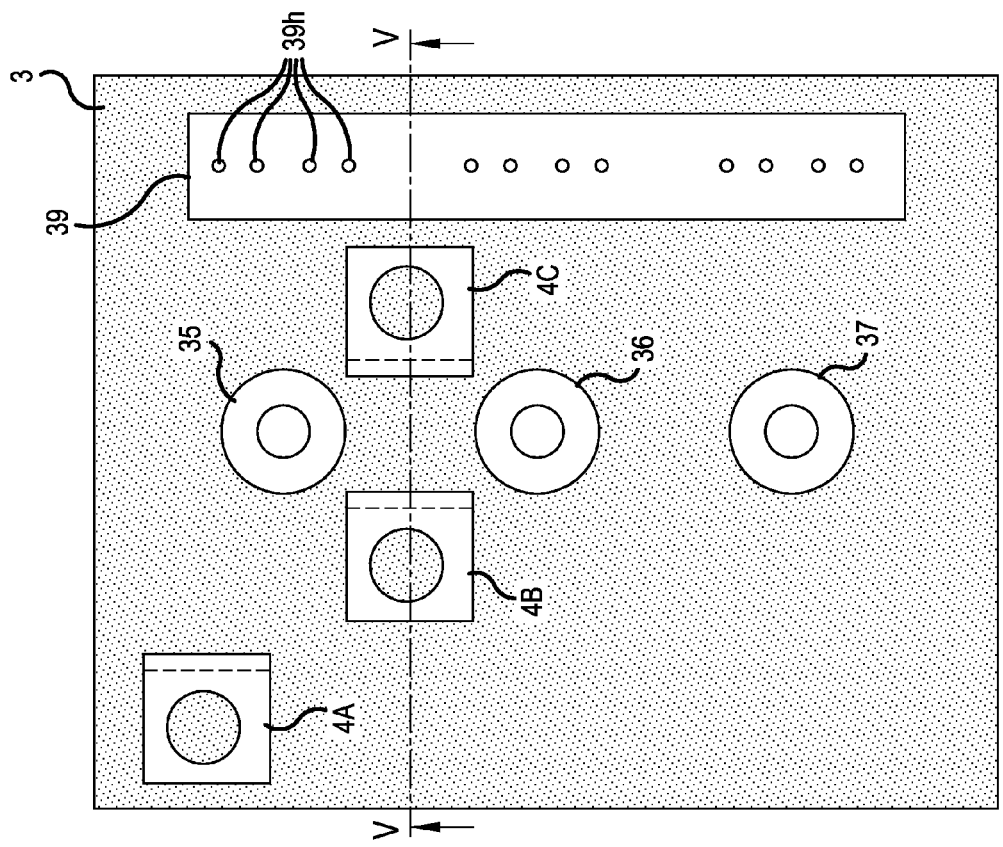
FIGS. 4A and 4B are diagrams illustrating the composite module illustrated in FIG. 3 accommodated in a protective case.
Figure 4A:
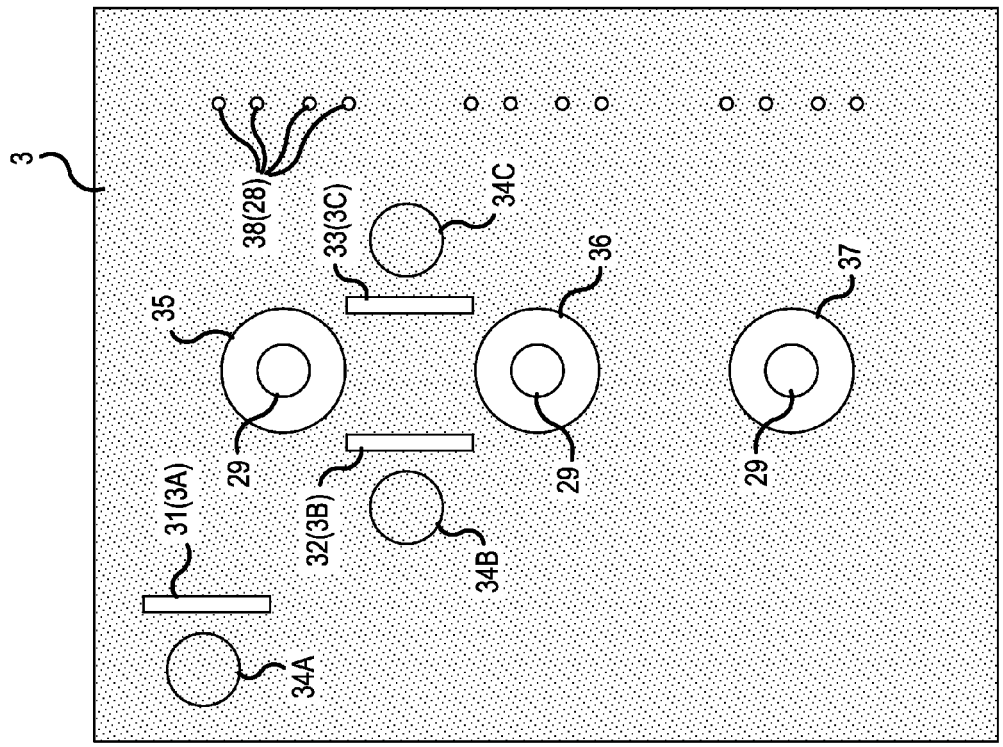
Figure 5:
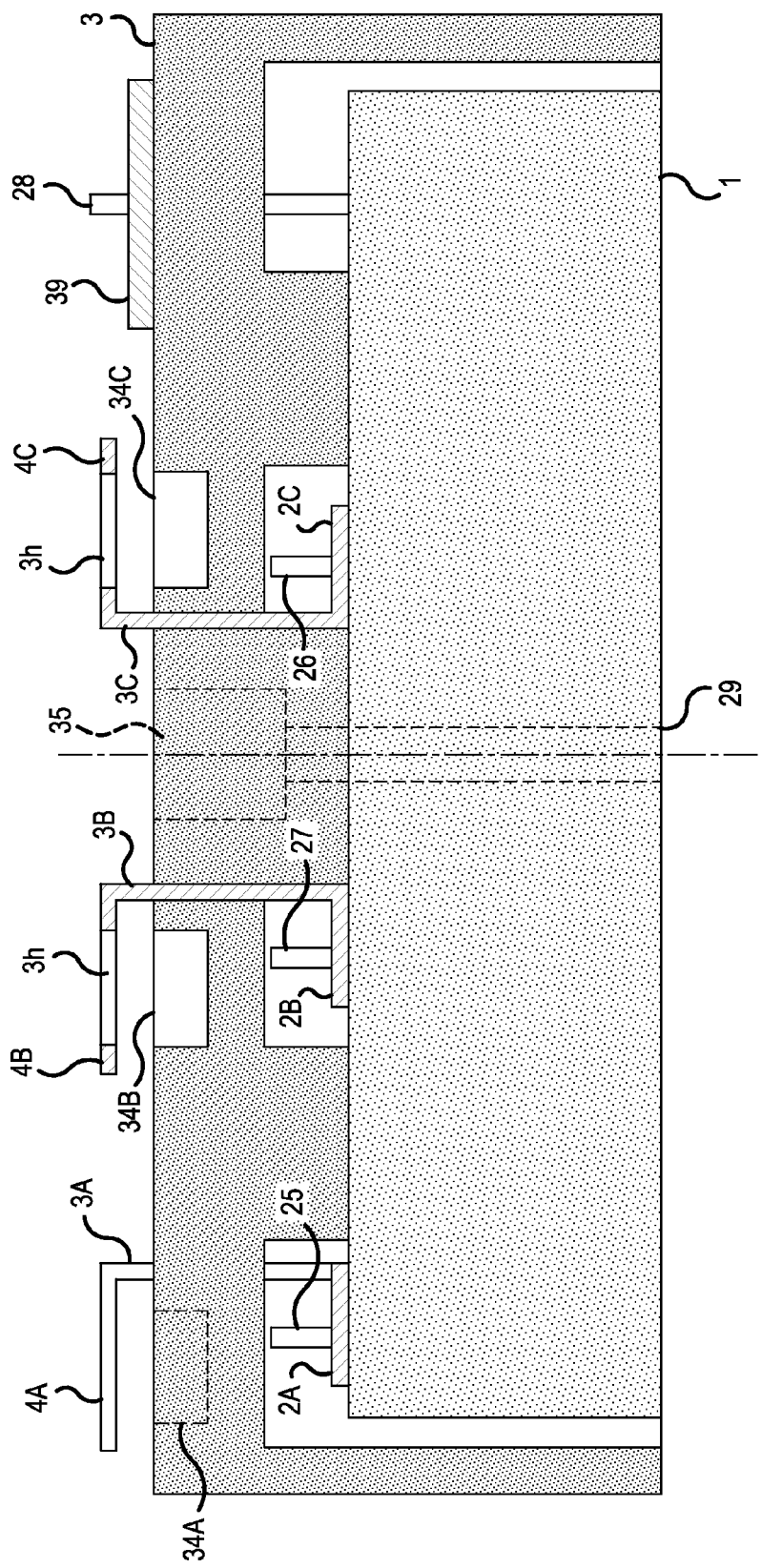
FIG. 5 is a cross-sectional view taken along the line V-V of FIG. 4B.

Next, a process of accommodating the integrated semiconductor device in a predetermined protective case to integrate them will be described. FIGS. 4A and 4B are diagrams illustrating the composite module illustrated in FIG. 3 which is accommodated in the protective case. FIG. 4A is a plan view illustrating a state before the main terminal is formed and FIG. 4B is a plan view illustrating a state after the main terminal is formed. FIG. 5 is a cross-sectional view taken along the line V-V of FIG. 4B.

The protective case 3 is an insulating resin case and is formed as an envelope in which an opening through which three power semiconductor modules 1 that are integrated by the main terminal plates 2A to 2C as illustrated in FIG. 3 can be accommodated is formed in the bottom. Insertion holes 31 to 33, which extend from the surface of the protective case 3 to the inside thereof and have sizes corresponding to the cross-sectional shapes of the rising pieces 3A to 3C of the main terminal plates 2A to 2C, and counterbores 34A to 34C, which have a size corresponding to the round holes 3h formed in the rising piece 3A to 3C, are provided in the protective case 3.

In addition, opening portions 35 to 37, which correspond to the through holes 29 of the power semiconductor modules 1 and have a diameter greater than the through hole 29, and opening portions 38 for drawing the pin-shaped conductors 28 of each power semiconductor module 1 to the outside are formed in the surface of the protective case 3. As illustrated in FIG. 4B, a control substrate 39 in which through holes 39h corresponding to 12 pin-shaped conductors 28 are formed is arranged on the surface of the protective case 3 and forms a desired control circuit for the semiconductor circuit formed by the composite module in the protective case 3.

When the three power semiconductor modules 1 are accommodated in the protective case 3 while being integrated by the main terminal plates 2A to 2C, the leading ends of the rising pieces 3A to 3C, which protrude from the protective case 3 to the outside, are bent. Main terminal segments 4A to 4C having the round holes 3h for bolts or screws are parallel to the upper surface of the protective case 3 and form a positive electrode terminal, a negative electrode terminal, and an output terminal, respectively. In this case, the counterbores 34A to 34C of the protective case 3 are arranged at positions corresponding to the round holes 3h of the bent main terminal segments 4A to 4C and function as fastening bolt holes when the main terminal plates 2A to 2C are fixed to an external connection plate (for example, a bus bar).

Figure 6:
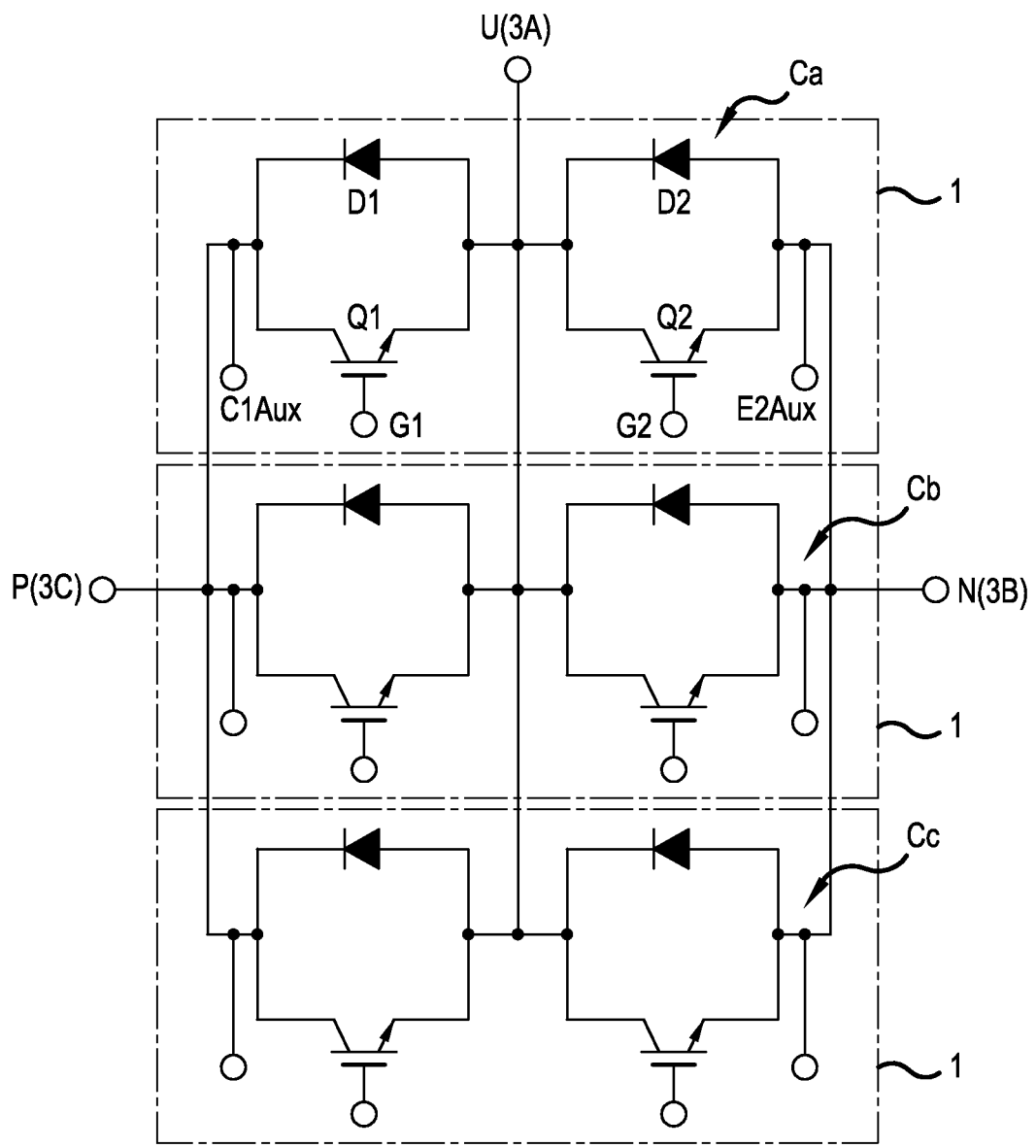
FIG. 6 is an equivalent circuit diagram illustrating a semiconductor circuit formed by the composite module illustrated in FIG. 3.

FIG. 6 is an equivalent circuit diagram illustrating the semiconductor circuit formed by the composite module illustrated in FIG. 3. Semiconductor circuits Ca to Cc formed by three power semiconductor modules 1 form half-bridge circuits which are connected in parallel to each other between a positive electrode terminal P(C1) and a negative electrode terminal N(E2). In this way, the semiconductor circuits Ca to Cc as the composite module have a function of improving the current capacity of a single power semiconductor module 1 three times. The composite module illustrated in FIG. 3 is integrated with the protective case 3 by bolts which are inserted into the through holes 29 of the power semiconductor modules 1 through the opening portions 35 to 37 in the upper surface of the protective case 3. At that time, the copper plate 30 (see FIG. 1) which forms a radiating surface of the power semiconductor module 1 is exposed from the lower surface of the protective case 3. Therefore, when the radiation fin is fixed to the lower surface of the protective case 3 by three bolts which are inserted into the opening portions 35 to 37 of the protective case 3, it is possible to bring the radiation fin into close contact with the bottom of each power semiconductor module 1.

As described above, in the semiconductor device according to Embodiment 1, the semiconductor circuits formed by a plurality of power semiconductor modules 1 are integrated by the main terminal plates 2A to 2C and can be accommodated as a composite module in the protective case 3. In addition, it is not necessary to mount each power semiconductor module 1 to the cooling fin. It is possible to reliably mount the cooling fins only by fixing a pair of cooling fins to the integrated composite module in the protective case 3 with a minimum number of bolts. Therefore, it is possible to reduce the number of manufacturing facilities for each type of product. As a result, it is possible to reduce the number of types of jigs or tools, to adjust the type of products to reduce quality management costs, and to improve mass production efficiency.

That is, the fastening through hole 29 is provided in each power semiconductor module 1. Therefore, it is possible to reliably ensure a stable thermal conduction path between the cooling fin and each of a plurality of power semiconductor modules 1 connected by the main terminal plates 2A to 2C. As a result, a structure which can better respond to an increase in current density than the semiconductor device according to the related art is obtained and it is possible to reduce the size of each semiconductor device and to provide a semiconductor device in which each of the semiconductor chips 21a and 21b forming the composite module has high radiation efficiency and the cooling fin has high area efficiency.

In the semiconductor device according to the related art, in some cases, the radiation fin is thermally deformed during cooling, and the contact interface of the semiconductor module mounted on the radiation fin is deformed, which makes it difficult to increase the adhesion between the base plate and the fin and to ensure radiation efficiency. In contrast, in the above-described embodiment, the size of the module is smaller than that in the related art and each power semiconductor module 1 is held by the individual fastening means. Therefore, the composite module operates so as to follow the deformation and displacement of the components. That is, even when the size of the semiconductor module mounted on the radiation fin increases due to an increase in the current capacity of the semiconductor circuit, the cooling state of the semiconductor module is stabilized during the actual operation and good characteristics can be expected in terms of improving reliability.

As such, since the semiconductor device has a common basic structure, it is easy to perform integration according to necessary rating and it is possible to easily achieve a circuit structure satisfying requirements for various types of rating. In addition, it is possible to improve the efficiency of heat transfer to a cooler and to easily prevent thermal deformation which occurs when a mounting size increases. Therefore, it is possible to improve the production efficiency, characteristics, and reliability of the semiconductor device. In the above-described embodiment, the composite module is formed by three power semiconductor modules 1. However, the composite module may be formed by four or more power semiconductor modules or two power semiconductor modules depending on usage.

Embodiment 2

Figure 7A:
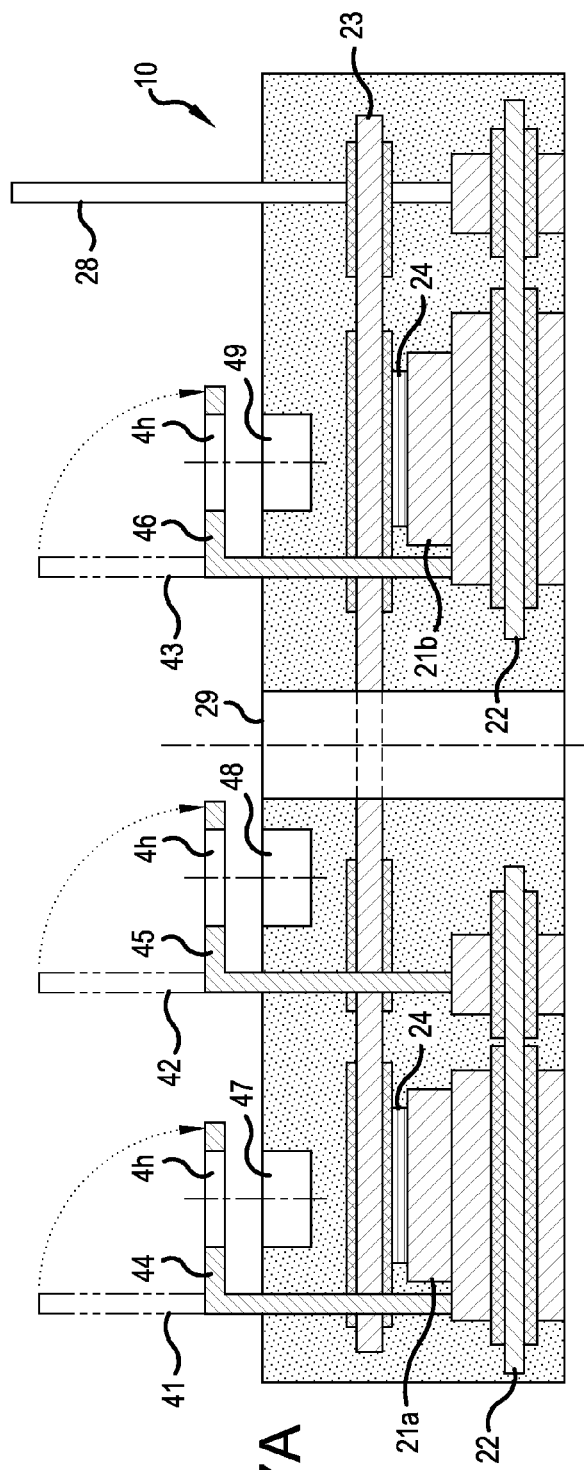
FIG. 7A is a cross-sectional view and FIG. 7B is a plan view illustrating a power semiconductor module according to a second embodiment.
Figure 7B:
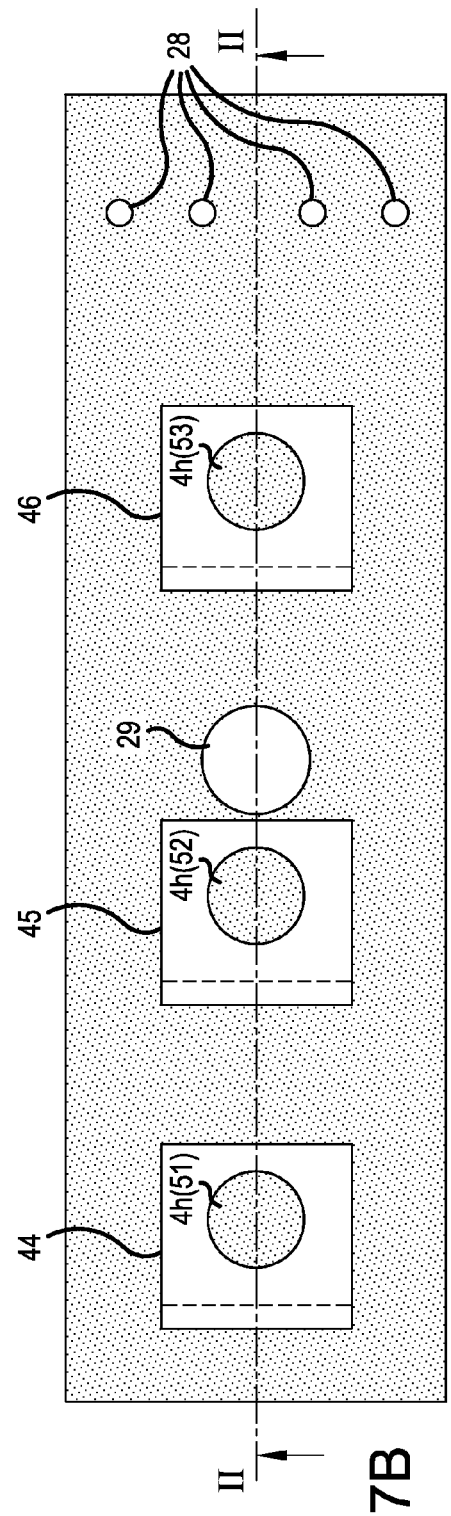

FIG. 7A is a cross-sectional view and FIG. 7B is a plan view illustrating a power semiconductor module according to a second embodiment.

A power semiconductor module 10 illustrated in FIG. 7 differs from the power semiconductor module 1 according to Embodiment 1 in that plate-shaped conductors 41 to 43 replace the pin-shaped conductors 25 to 27. The plate-shaped conductors 41 to 43 form an external input terminal (collector terminal C1), an external input terminal (emitter terminal E2), and an external output terminal (collector/emitter terminal C2/E1), respectively, and have fastening opening portions 4h provided at the leading ends. That is, each component of the power semiconductor module 10 is molded by an epoxy resin material, which is a thermosetting resin, and the leading ends of the plate-shaped conductors 41 to 43 are bent at an angle of 90 degrees to form three terminal portions 44 to 46 each having the fastening opening portion 4h.

In Embodiment 2, the correspondence of the collector terminal C1, the collector/emitter terminal C2/E1, and the emitter terminal E2 to the plate-shaped conductors 41 to 43 can vary depending on copper films 22a and 22b on an insulating substrate 22 and the wiring of a wiring substrate 23.

During resin molding, counterbores 47 to 49 are provided in the resin surface of the power semiconductor module 10 at positions corresponding to the fastening opening portions 4h of the terminal portions 44 to 46. The counterbores 47 to 49 are formed at a depth corresponding to the length of a bolt or a screw which is used for fastening.

Figure 8:
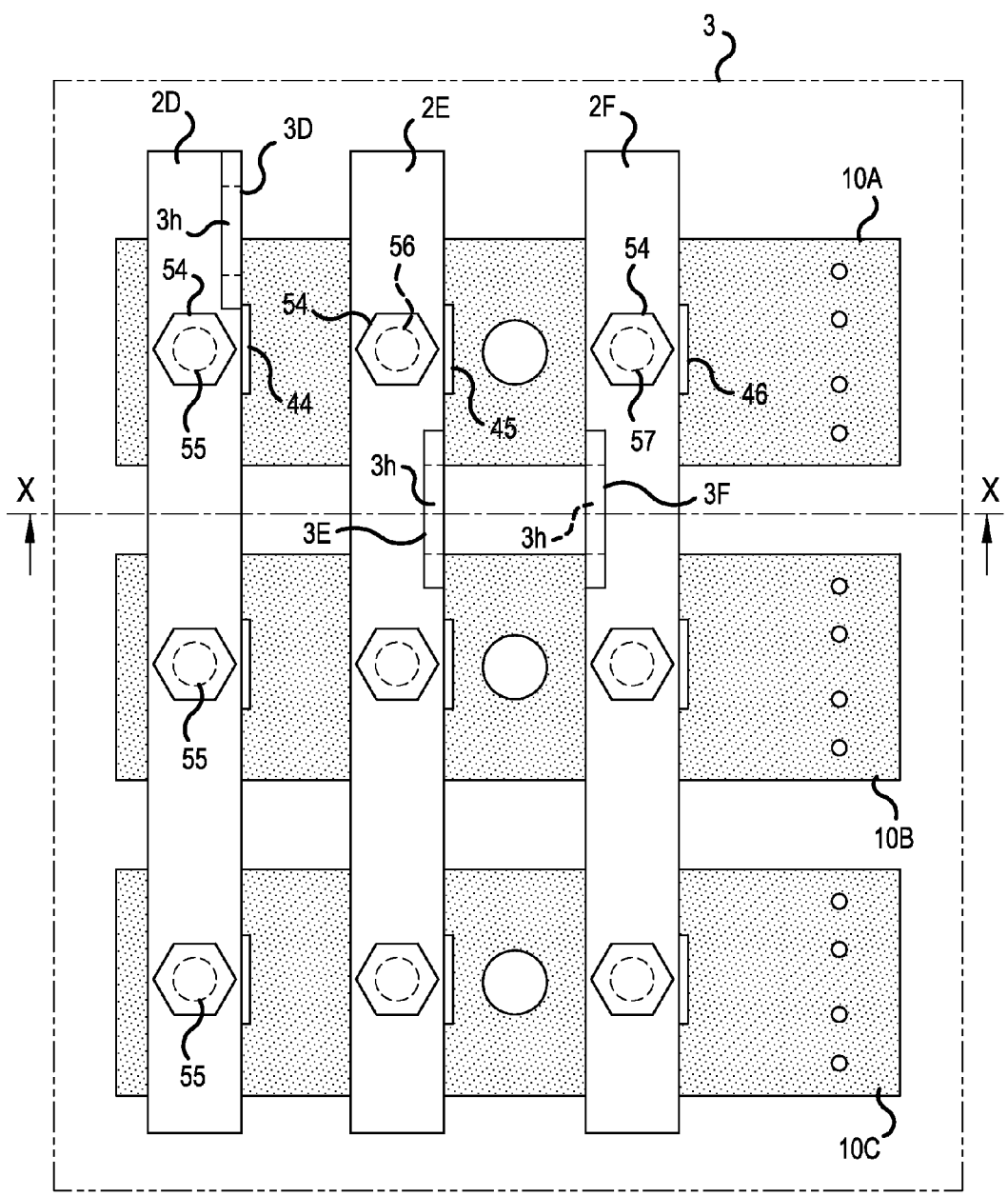
FIG. 8 is a plan view illustrating a composite module obtained by integrating the power semiconductor modules illustrated in FIG. 7.
Figure 9:
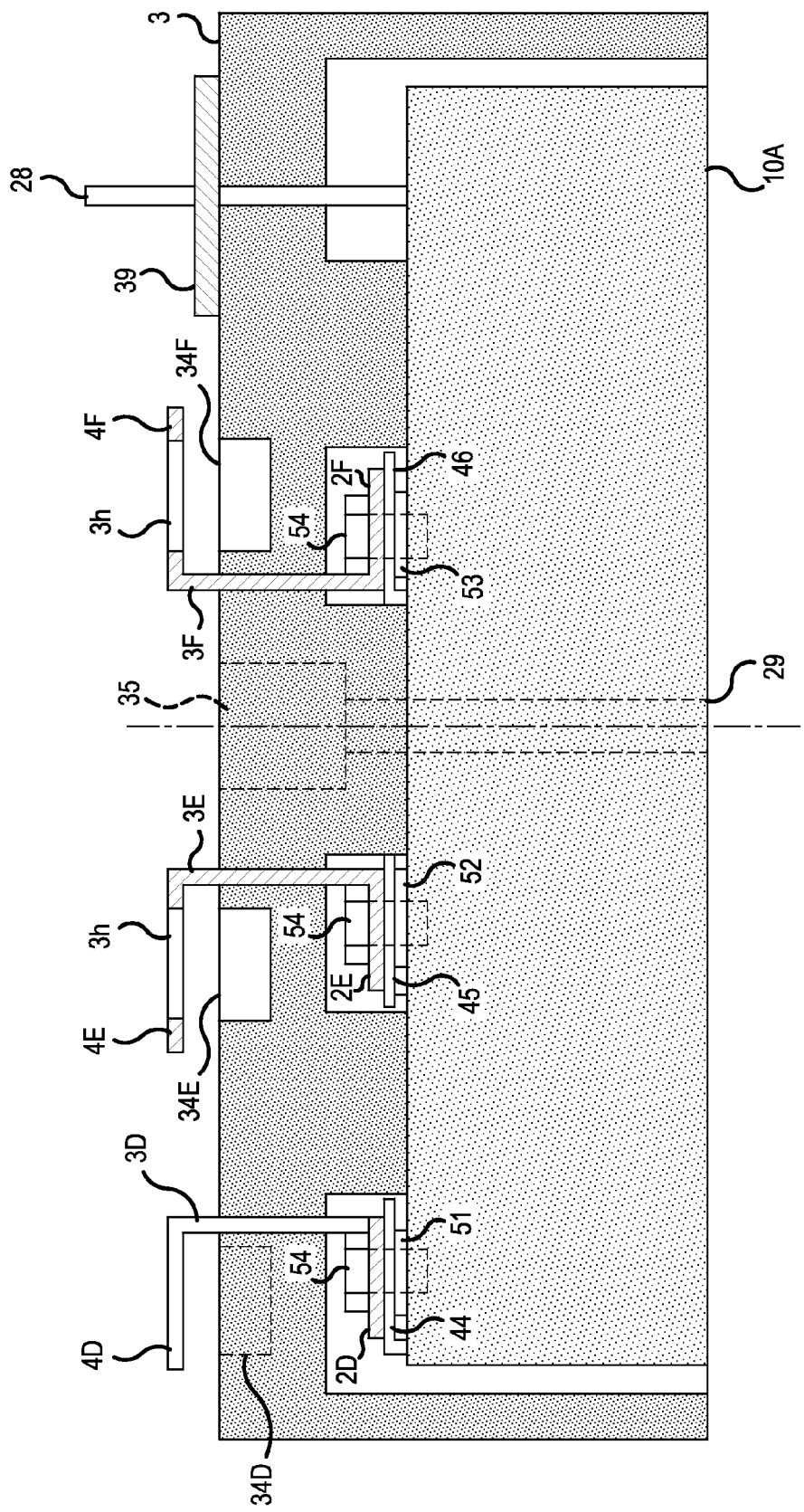
FIG. 9 is a cross-sectional view taken along the line X-X of FIG. 8.

FIG. 8 is a plan view illustrating a composite module obtained by integrating the power semiconductor modules illustrated in FIGS. 7A and 7B. FIG. 9 is a cross-sectional view taken along the line X-X of FIG. 8. The three terminal portions 44 to 46 are formed in each of three power semiconductor modules 10A to 10C accommodated in a protective case 3. Among them, a main terminal plate 2D is fixed to the terminal portions 44 of the power semiconductor modules 10A to 10C by bolts 54 which are inserted into the fastening opening portions 4h and a conduction path is formed therebetween. The main terminal plate 2D includes a bolt insertion hole 55 which is provided at a predetermined position and has such a size that a bolt can be inserted into the bolt insertion hole and the fastening opening portion 4h formed in the terminal portion 44. Similarly, a main terminal plate 2E is fixed to the terminal portions 45 of the power semiconductor modules 10A to 10C and a main terminal plate 2F is fixed to each terminal portion 46. In this way, a conduction path is formed therebetween. Portions of the main terminal plates 2D to 2F are bent to form rising pieces 3D to 3F, similarly to the main terminal plates 2A to 2C used in Embodiment 1.

The power semiconductor module 1 illustrated in FIG. 1 is used for a semiconductor device with a small size and low capacity. In contrast, in the power semiconductor module 10 according to Embodiment 2, the plate-shaped conductors 41 to 43 with high conduction capability are used and the plate-shaped conductors 41 to 43 and the main terminal plates 2D to 2F are firmly fixed to each other by screws or bolts.

In this embodiment, the protective case 3 is an insulating resin case and is formed as an envelope in which an opening through which three power semiconductor modules 10A to 10C integrated by the main terminal plates 2A to 2C can be accommodated is formed in the bottom. Through holes 39h corresponding to pin-shaped conductors 28 are formed in a control substrate 39 and the control substrate 39 is provided on the upper surface of the protective case 3. The control substrate 39 has the same structure as that illustrated in FIG. 5 (Embodiment 1), corresponding portions are denoted by the same numerals, and the detailed description thereof will not be repeated. When the main terminal plates 2D to 2F are connected to the terminal portions 44 to 46 by bolts 54, washers 51 to 53 may be inserted between the rear surfaces of the terminal portions 44 to 46 and the power semiconductor modules 10A to 10C, if necessary.

In this way, the three power semiconductor modules 10A to 10C are connected to each other and the rising pieces 3D to 3F which are respectively provided in the main terminal plates 2D to 2F are drawn to the outside of the protective case 3 and are then bent to form main terminal segments 4D to 4F. Therefore, in the semiconductor device according to Embodiment 2, semiconductor circuits formed by the power semiconductor modules 10A to 10C can be connected by the plate-shaped conductors 41 to 43 with high conduction capability and it is possible to reliably respond to an increase in the current capacity of the composite module.

Embodiment 3

FIGS. 10A and 10B are diagrams illustrating a composite module according to a third embodiment. FIG. 10A is a diagram illustrating a semiconductor module before it is accommodated in a protective case and FIG. 10B is a diagram illustrating a state in which a main terminal segment is bent above the surface of the protective case.

In this embodiment, the composite module includes three power semiconductor modules 1A to 1C and main terminal plates 2B, 2C, and 2G (2GU, 2GV, and 2GW). Similarly to the power semiconductor module 1 according to Embodiment 1, each of the power semiconductor modules 1A to 1C includes pin-shaped conductors 25 to 27 serving as external input/output terminals and pin-shaped conductors 28 forming control (auxiliary) terminals (see FIG. 1). The third embodiment differs from Embodiment 1 in that independent main terminal segments 4G (4GU, 4GV, and 4GW) are drawn from the pin-shaped conductors (pin terminals) forming external input terminals (collector terminals C1) of the power semiconductor modules 1A to 1C to the outside of a protective case 5.

Therefore, the conduction paths of the semiconductor circuits in the power semiconductor modules 1A to 1C are formed only by two main terminal plates 2B and 2C and the two main terminal plates 2B and 2C are drawn as the main terminal segments 4B and 4C to the protective case 5. A main terminal plate 2G is connected to the pin-shaped conductors of the power semiconductor modules 1A to 1C and rising pieces 3G (3GU, 3GV, and 3GW) are drawn from the protective case 5 to form three independent main terminal segments 4G.

Figure 11:
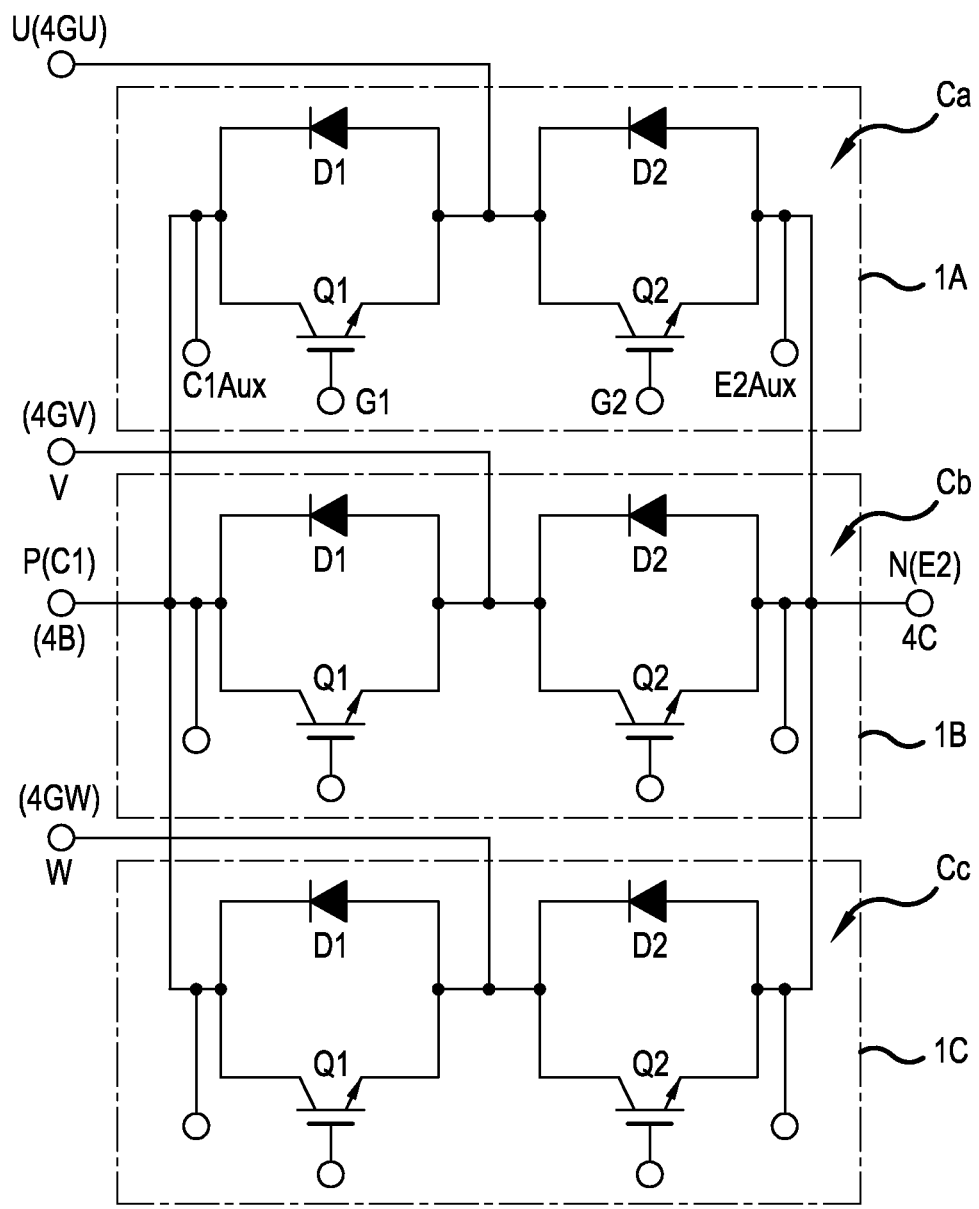
FIG. 11 is an equivalent circuit diagram illustrating a semiconductor circuit formed by the composite module illustrated in FIG. 10.

FIG. 11 is an equivalent circuit diagram illustrating a semiconductor circuit formed by the composite module illustrated in FIG. 10. The semiconductor circuits formed by the three power semiconductor modules 1A to 1C are connected in parallel between a positive electrode terminal P(C1) and a negative electrode terminal N(E2) to form a three-phase full-bridge circuit. In a semiconductor circuit Ca formed by the power semiconductor module 1A, the main terminal segment 4GU is drawn as a U terminal from an intermediate terminal of the bridge. In semiconductor circuits Cb and Cc which are respectively formed by the power semiconductor modules 1B and 1C, the main terminal segments 4GV and 4GW are independently drawn as a V terminal and a W terminal from the intermediate terminal of the bridge, respectively.

The circuit structure illustrated in FIG. 11 is an illustrative example and various semiconductor circuits can be formed in the semiconductor device according to Embodiment 3, depending on how to draw the main terminal segments 4B, 4C, and 4G.

Embodiment 4

Figure 12A:
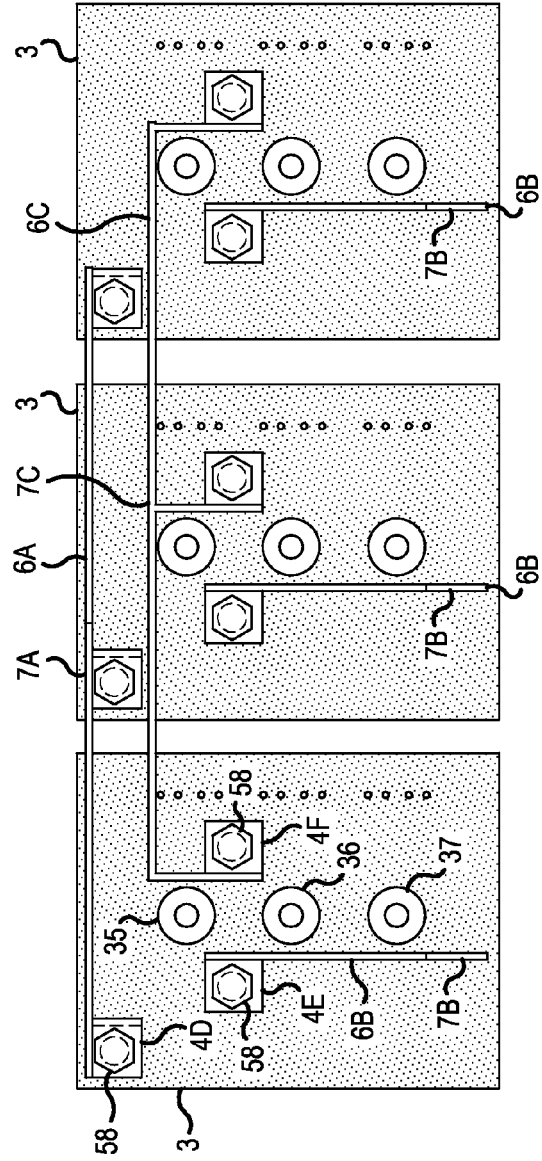
FIGS. 12A and 12B are diagrams illustrating a host composite module obtained by integrating the composite modules illustrated in FIG. 3.
Figure 12B:
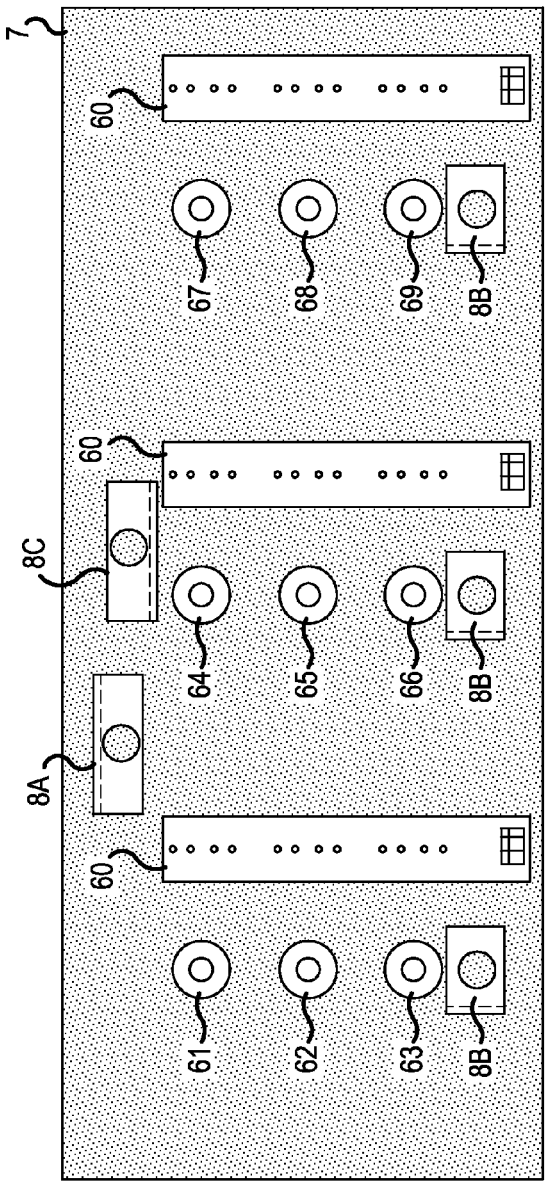

FIGS. 12A and 12B are diagrams illustrating a host composite module obtained by integrating the composite modules illustrated in FIG. 3. FIG. 12A is a diagram illustrating a semiconductor module before it is accommodated in a protective case and FIG. 12B is a diagram illustrating a state in which a main terminal segment is bent above the surface of the protective case.

In the host composite module illustrated in FIG. 12A, three composite modules which are accommodated in each protective case 3 are connected as a host semiconductor circuit by second main terminal plates 6A to 6C to form a full-bridge circuit that improves the current capacity of a semiconductor element. In this embodiment, for example, the composite module illustrated in FIG. 9 is used. However, the composite module illustrated in FIG. 5 may be used.

The second main terminal plates 6A are connected to each other by main terminal segments 4D formed in the three protective cases 3 and bolts 58 and include a rising piece 7A provided at a predetermined position. The second main terminal plates 6B in each protective case 3 are connected by main terminal segments 4E and the bolts 58 and include rising pieces 7B which form independent host main terminal segments 8B. The second main terminal plates 6C are connected to each other by main terminal segments 4F of the three protective cases 3 and the bolts 58 and include rising pieces 7C provided at predetermined positions. The shape or arrangement of the second main terminal plates 6A to 6C needs to be set so as not to block opening portions 35 to 37 of each protective case 3.

FIG. 12B illustrates a state in which the three protective cases 3 are accommodated in a host protective case 7 and host main terminal segments 8A to 8C are bent. Five host main terminal segments 8A, 8B (×3), and 8C and three control substrates 60 are arranged on the surface of host protective case 7. In addition, nine opening portions 61 to 69 which pass through the host protective case 7 are connected to the opening portions 35 to 37 of each protective case 3.

The opening portions 61 to 69 have the same shape as the through holes of a total of nine power semiconductor modules which are arranged in three protective cases 3. Bolts are inserted into the opening portions 61 to 69. In this way, it is possible to fix a radiation fin to the bottom of the host protective case 7 with a minimum number of bolts. In addition, three power semiconductor modules forming the composite module are simply integrated by the host protective case 7 and reliably come into pressure contact with the radiation fin.

Embodiment 5

Figure 13:
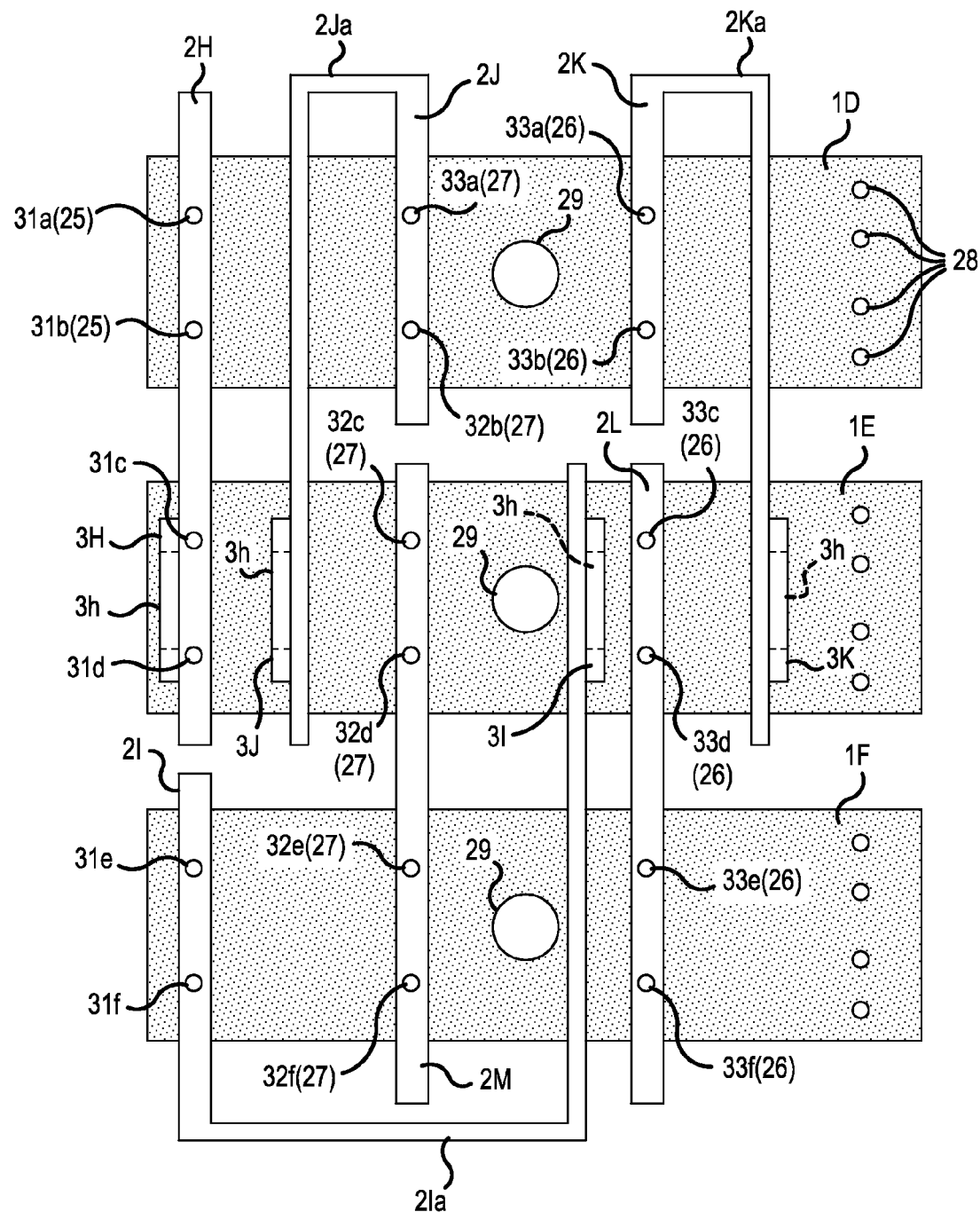
FIG. 13 is a plan view illustrating a composite module obtained by integrating power semiconductor modules according to a fifth embodiment.
Figure 14:
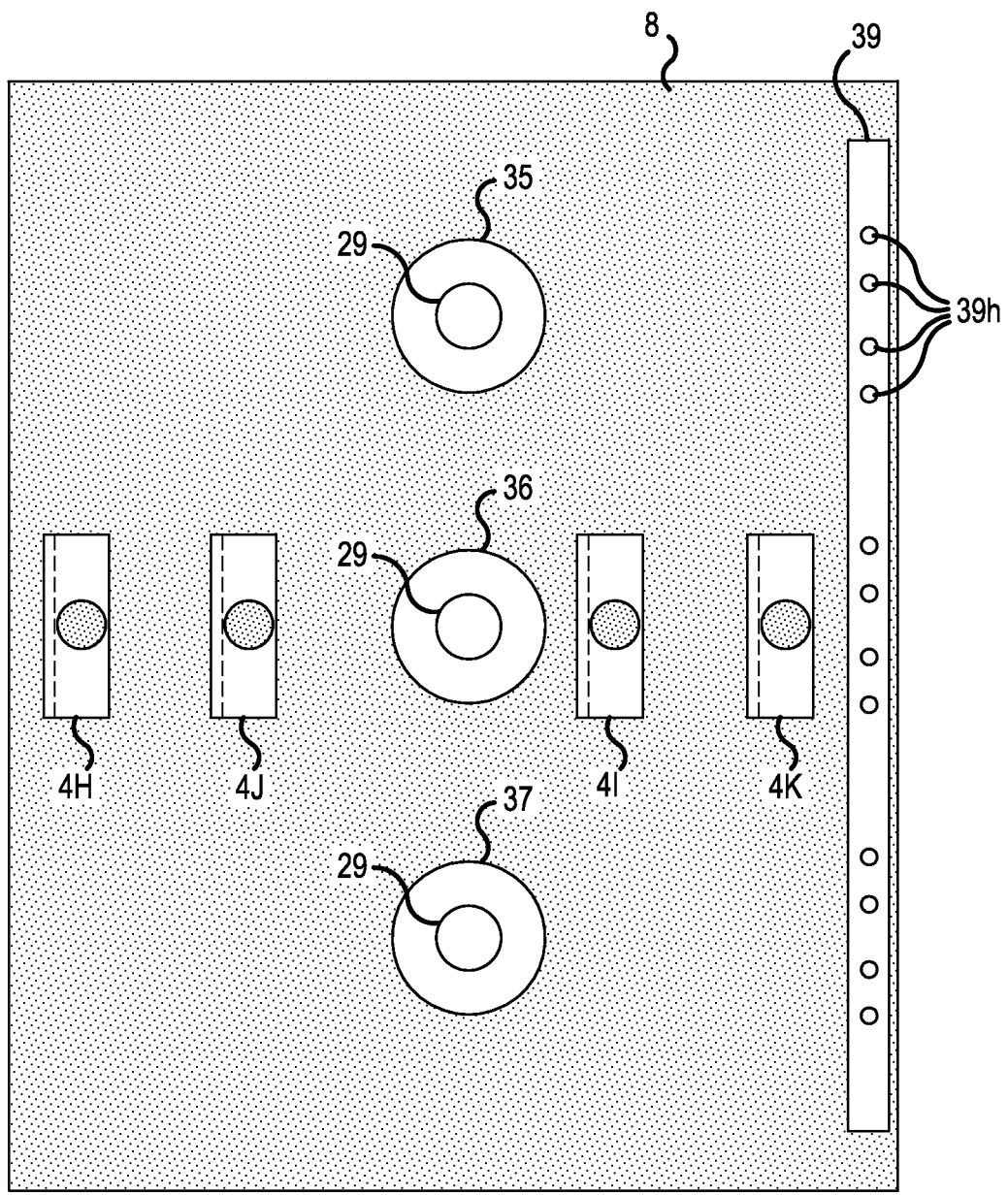
FIG. 14 is a plan view illustrating a state after the composite module illustrated in FIG. 13 is accommodated in a protective case and main terminals are formed.

FIG. 13 is a plan view illustrating a composite module obtained by integrating power semiconductor modules according to a fifth embodiment. FIG. 14 is a plan view illustrating a state after the composite module illustrated in FIG. 13 is accommodated in a protective case and main terminals are formed.

In this embodiment, the composite module includes three power semiconductor modules 1D to 1F, main terminal plates 2H to 2K, and wiring plates 2L and 2M which are conductive members. In FIG. 13, wiring portions 2Ia to 2Ka are portions of the main terminal plates 2I to 2K and connect portions of the main terminal plates that are connected to pin-shaped conductors of the power semiconductor module, which will be described below, and rising pieces 3H to 3K which will be described below.

Each of the power semiconductor modules 1D to 1F has the same structure as the power semiconductor module 1 according to Embodiment 1. That is, each power semiconductor module includes pin-shaped conductors 25 to 27, which will be external input/output terminals, and pin-shaped conductors 28, which form control (auxiliary) terminals (see FIG. 1).

In the composite module illustrated in FIG. 13, the main terminal plate 2H is connected to the pin-shaped conductors 25 of the power semiconductor modules 1D and 1E and the main terminal plate 2I is connected to the pin-shaped conductors 25 of the power semiconductor module 1F. The rising piece 3H is formed in the main terminal plate 2H, and the rising piece 3I is formed in the main terminal plate 2I through the wiring portion 2Ia.

In the composite module illustrated in FIG. 13, the main terminal plate 2J is connected to the pin-shaped conductors 27 of the power semiconductor module 1D. The rising piece 3J is formed in the main terminal plate 2J through the wiring portion 2Ja.

In the composite module illustrated in FIG. 13, the main terminal plate 2K is connected to the pin-shaped conductors 26 of the power semiconductor module 1D. The rising piece 3K is formed in the main terminal plate 2K through the wiring portion 2Ka.

The wiring plate 2L is connected to the pin-shaped conductors 26 of the power semiconductor modules 1E and 1F, and the wiring plate 2M is connected to the pin-shaped conductors 27 of the power semiconductor modules 1E and 1F.

As illustrated in FIG. 13, the rising pieces 3H to 3K are formed so as to be arranged in a straight line. In the connection of the main terminal plates 2H to 2K, the wiring plates 2L and 2M, and the pin-shaped conductors 25 to 27, as described in Embodiment 1, the pin-shaped conductors 25 to 27 of the power semiconductor modules 1D to 1F are inserted into through holes 31a to 33f formed in the main terminal plates 2H to 2K and the wiring plates 2L and 2M. In this way, the main terminal plates 2H to 2K, the wiring plates 2L and 2M, and the power semiconductor modules 1D to 1F are bonded to each other.

The composite module is accommodated in the protective case 8, with the rising pieces 3H to 3K being inserted into through holes which are formed so as to correspond to the rising pieces 3H to 3K, and the rising pieces 3H to 3K are bent. In this way, as illustrated in FIG. 14, main terminal segments, which are an output terminal U (4H), a negative electrode terminal N (4J), an intermediate terminal M (4I), and a positive electrode terminal P (4K), are arranged in a straight line.

An equivalent circuit of the composite module illustrated in FIG. 13 will be described with reference to FIG. 15.

Figure 15:
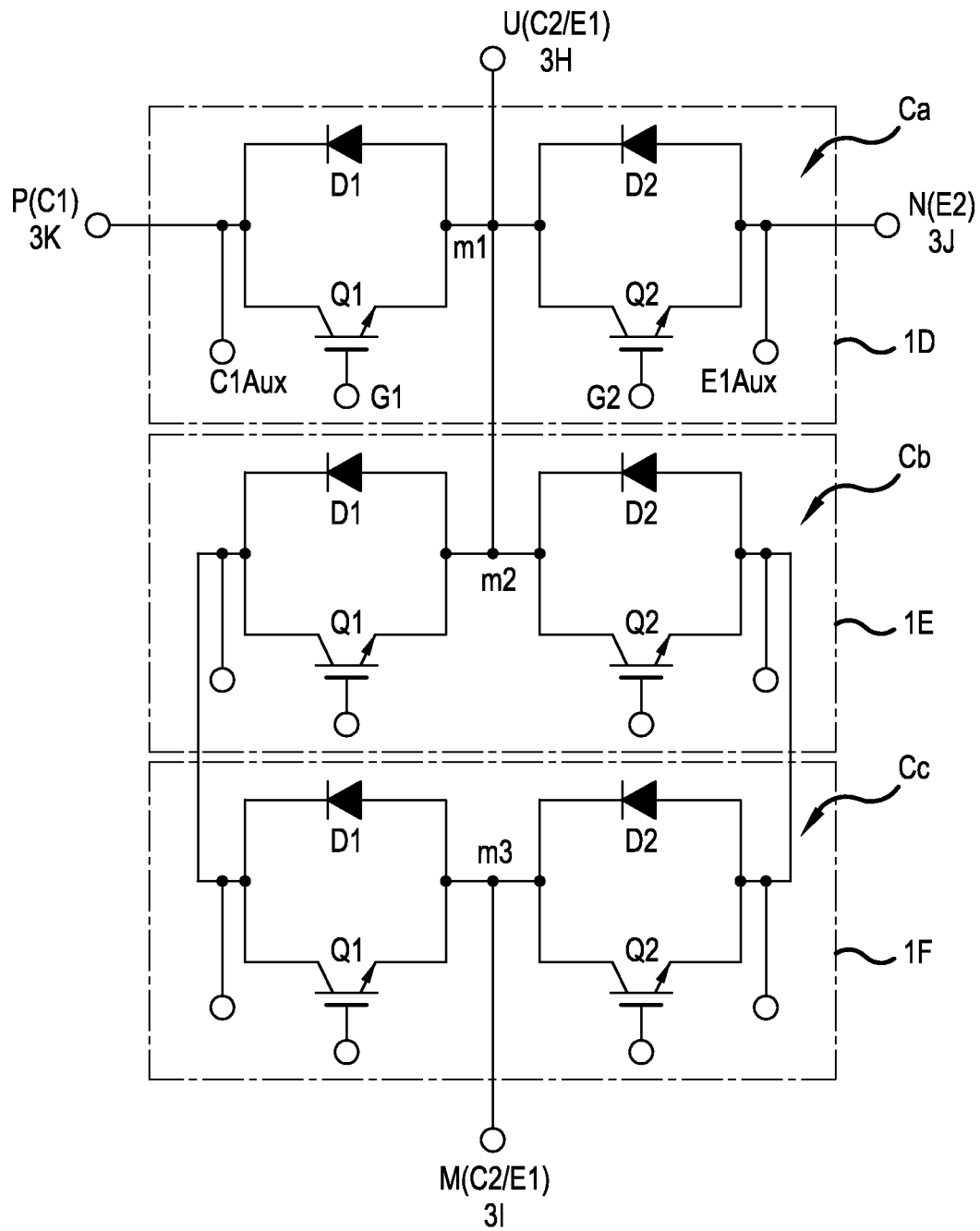
FIG. 15 is an equivalent circuit diagram illustrating a semiconductor circuit formed by the composite module illustrated in FIG. 13.

FIG. 15 is an equivalent circuit diagram illustrating the semiconductor circuit formed by the composite module illustrated in FIG. 13.

In the semiconductor circuits formed by the three power semiconductor modules 1D to 1F illustrated in FIG. 13, an inverse parallel circuit of a transistor Q1 and a diode D1 and an inverse parallel circuit of a transistor Q2 and a diode D2 are connected in series to each other between a positive electrode terminal P(C1) and a negative electrode terminal N(E2). A semiconductor circuit Ca formed by the power semiconductor module 1D is a half-bridge circuit, in which an output terminal U is drawn from an intermediate point m1 between the inverse parallel circuits which are connected in series to each other.

Similarly to the power semiconductor module 1D, the power semiconductor modules 1E and 1F form semiconductor circuits (half-bridge circuits) Cb and Cc in which inverse parallel circuits are connected in series to each other. In addition, an inverse parallel connection circuit of a transistor Q1 and a diode D1 in the semiconductor circuit Cb and an inverse parallel connection circuit of a transistor Q1 and a diode D1 in the semiconductor circuit Cc are connected in series to each other such that the polarities thereof are reversed. In the example illustrated in FIG. 15, a collector of the transistor Q1 in the semiconductor circuit Cb is connected to a collector of the transistor Q1 in the semiconductor circuit Cc. Similarly, an inverse parallel connection circuit of a transistor Q2 and a diode D2 in the semiconductor circuit Cb and an inverse parallel connection circuit of a transistor Q2 and a diode D2 in the semiconductor circuit Cc are connected in series to each other such that the polarities thereof are reversed. In the example illustrated in FIG. 15, an emitter of the transistor Q2 in the semiconductor circuit Cb is connected to an emitter of the transistor Q2 in the semiconductor circuit Cc.

An intermediate point m2 between the inverse parallel circuits which are connected in series to each other in the semiconductor circuit Cb is connected to the intermediate point m1 of the semiconductor circuit Ca. An intermediate terminal M is drawn from an intermediate point m3 between the inverse parallel circuits which are connected in series to each other in the semiconductor circuit Cc.

According to this connection structure, the circuits which are connected in series to each other such that the polarities thereof are reversed are connected between the output terminal U (4H) and the intermediate terminal M (4I). As such, three power semiconductor modules with the same structure are connected as illustrated in FIGS. 13 and 15 to form a composite module which corresponds to one phase. In this way, it is possible to form a semiconductor device which can be applied to a three-level inverter disclosed in JP 2008-193779 A ("Patent Document 8").

Embodiment 6

In Embodiment 6, the semiconductor circuit of the composite module according to Embodiment 5 will be described when a reverse blocking (RB) IGBT is used.

Figure 16:
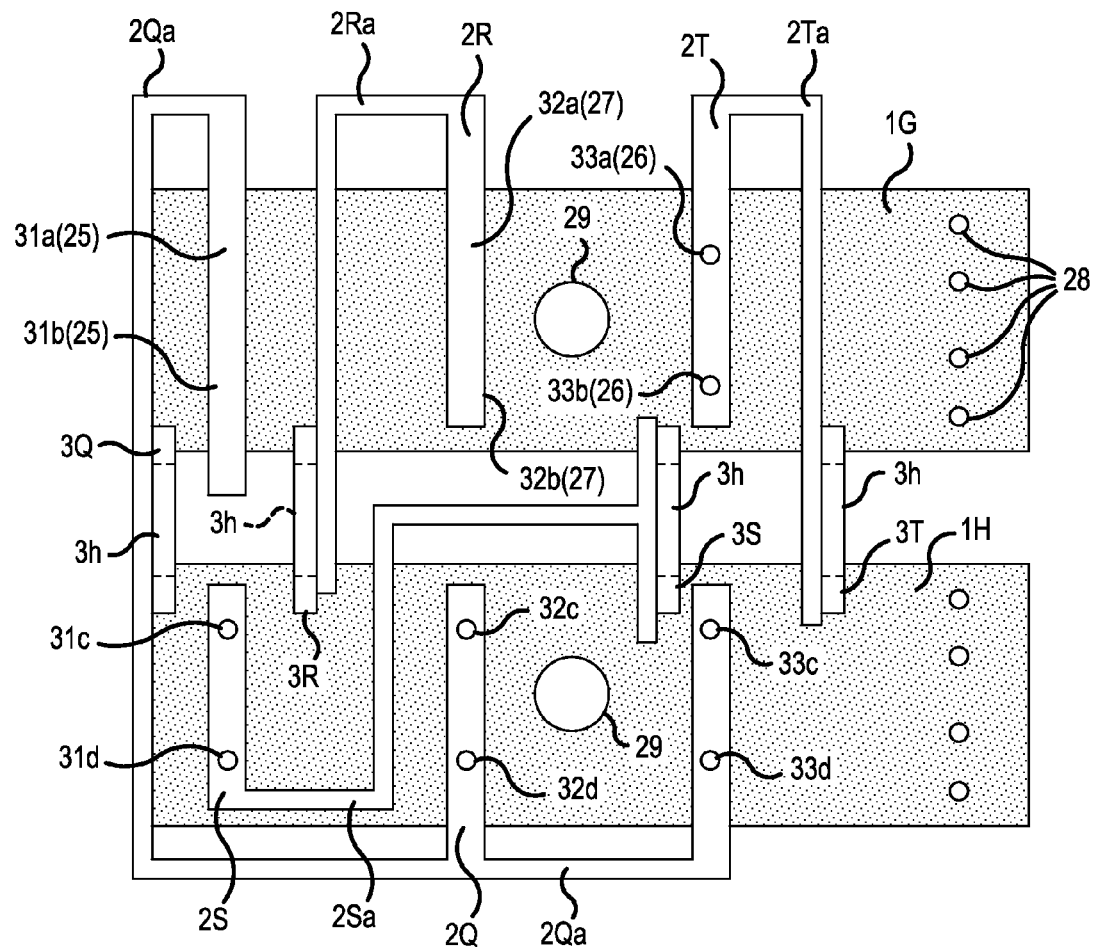
FIG. 16 is a plan view illustrating a composite module obtained by integrating power semiconductor modules according to a sixth embodiment.
Figure 17:
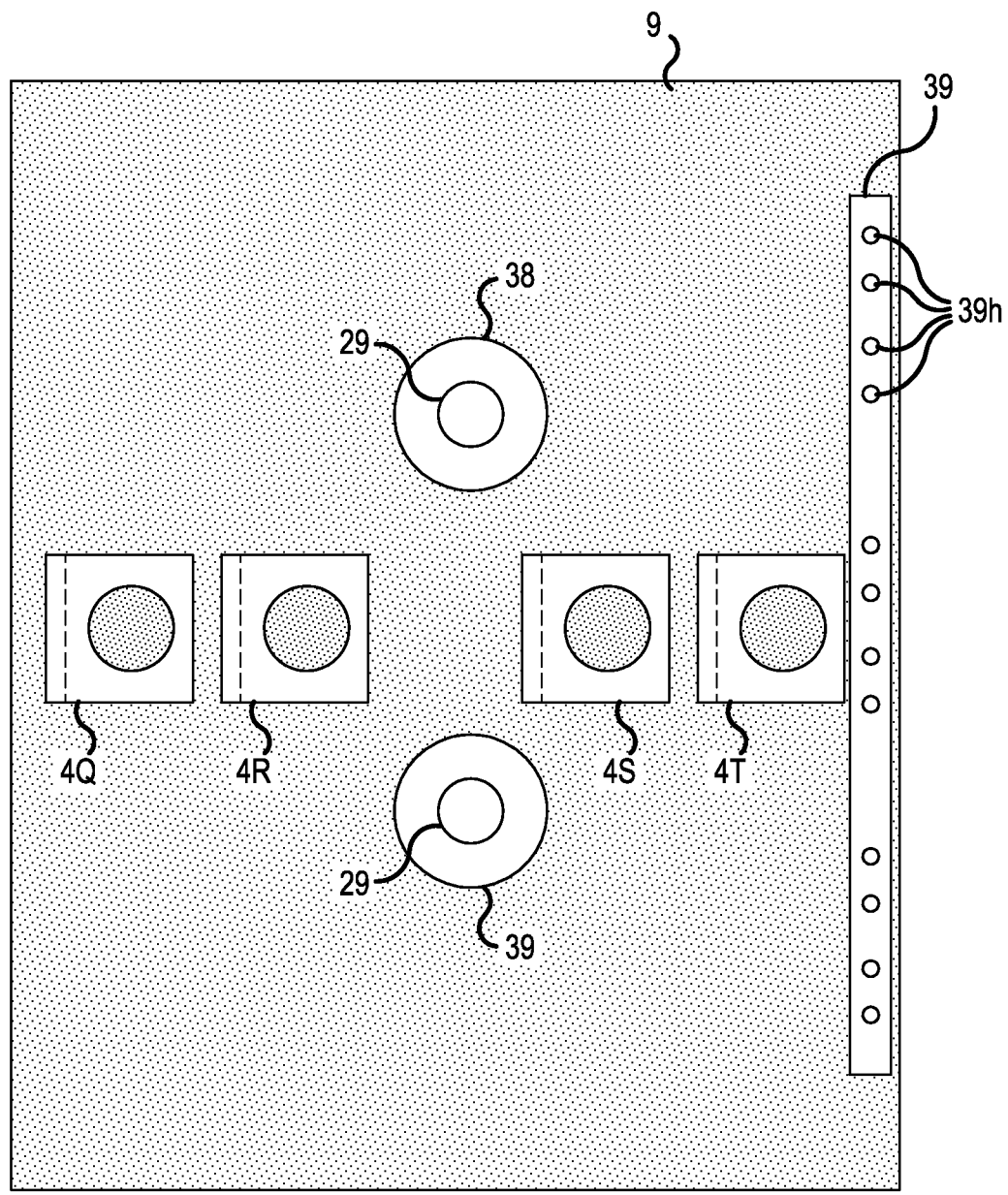
FIG. 17 is a plan view illustrating a state after the composite module illustrated in FIG. 16 is accommodated in a protective case and main terminals are formed.

FIG. 16 is a plan view illustrating a composite module obtained by integrating power semiconductor modules according to the sixth embodiment, and FIG. 17 is a plan view illustrating a state after the composite module illustrated in FIG. 16 is accommodated in a protective case and main terminals are formed.

The composite module according to this embodiment includes two power semiconductor modules 1G and 1H and main terminal plates 2Q to 2T. In FIG. 16, wiring portions 2Qa to 2Ta are portions of the main terminal plates 2Q to 2T and connect portions of the main terminal plates that are connected to pin-shaped conductors of the power semiconductor module, which will be described below, and rising pieces 3Q to 3T which will be described below.

Similarly to the power semiconductor module 1 according to Embodiment 1, the power semiconductor module 1G includes pin-shaped conductors 25 to 27, which will be external input/output terminals, and pin-shaped conductors 28 which form control (auxiliary) terminals (see FIG. 1).

The power semiconductor module 1H has the same shape as the power semiconductor module 1 according to Embodiment 1 and includes pin-shaped conductors 25 to 27, which will be external input/output terminals, and pin-shaped conductors 28 which form control (auxiliary) terminals. However, a reverse blocking IGBT is used as the switching device, which will be described below.

In the composite module illustrated in FIG. 16, the main terminal plate 2Q is connected to the pin-shaped conductor 25 of the power semiconductor module 1G and the pin-shaped conductors 26 and 27 of the power semiconductor module 1G. The main terminal plate 2S is connected to the pin-shaped conductor 25 of the power semiconductor module 1H. The rising piece 3Q is formed in the main terminal plate 2Q through the wiring portion 2Qa. The rising piece 3S is formed in the main terminal plate 2S through the wiring portion 2Sa.

In the composite module illustrated in FIG. 16, the main terminal plate 2R is connected to the pin-shaped conductor 27 of the power semiconductor module 1G. The rising piece 3R is connected to the main terminal plate 2R through the wiring portion 2Ra.

In the composite module illustrated in FIG. 16, the main terminal plate 2T is connected to the pin-shaped conductor 26 of the power semiconductor module 1G. The rising piece 3T is formed in the main terminal plate 2T through the wiring portion 2Ta.

As illustrated in FIG. 16, the rising pieces 3Q to 3T are formed so as to be arranged in a straight line. For the connection between the main terminal plates 2Q to 2T and the pin-shaped conductors 25 to 27, the pin-shaped conductors 25 to 27 of the power semiconductor modules 1G and 1H are inserted into through holes 31a to 33f which are formed in the main terminal plates 2Q to 2T as described in Embodiment 1. In this way, the main terminal plates 2Q to 2T and the power semiconductor modules 1G and 1H are bonded to each other.

The composite module is accommodated in a protective case 9, with the rising pieces 3Q to 3T being inserted into through holes which are formed so as to correspond to the rising pieces 3Q to 3T, and the rising pieces 3Q to 3T are bent. In this way, as illustrated in FIG. 17, the main terminal segments, which are an output terminal U(4Q), a negative electrode terminal N(4R), an intermediate terminal M(4S), and a positive electrode terminal P(4T), are arranged in a straight line.

Figure 18:
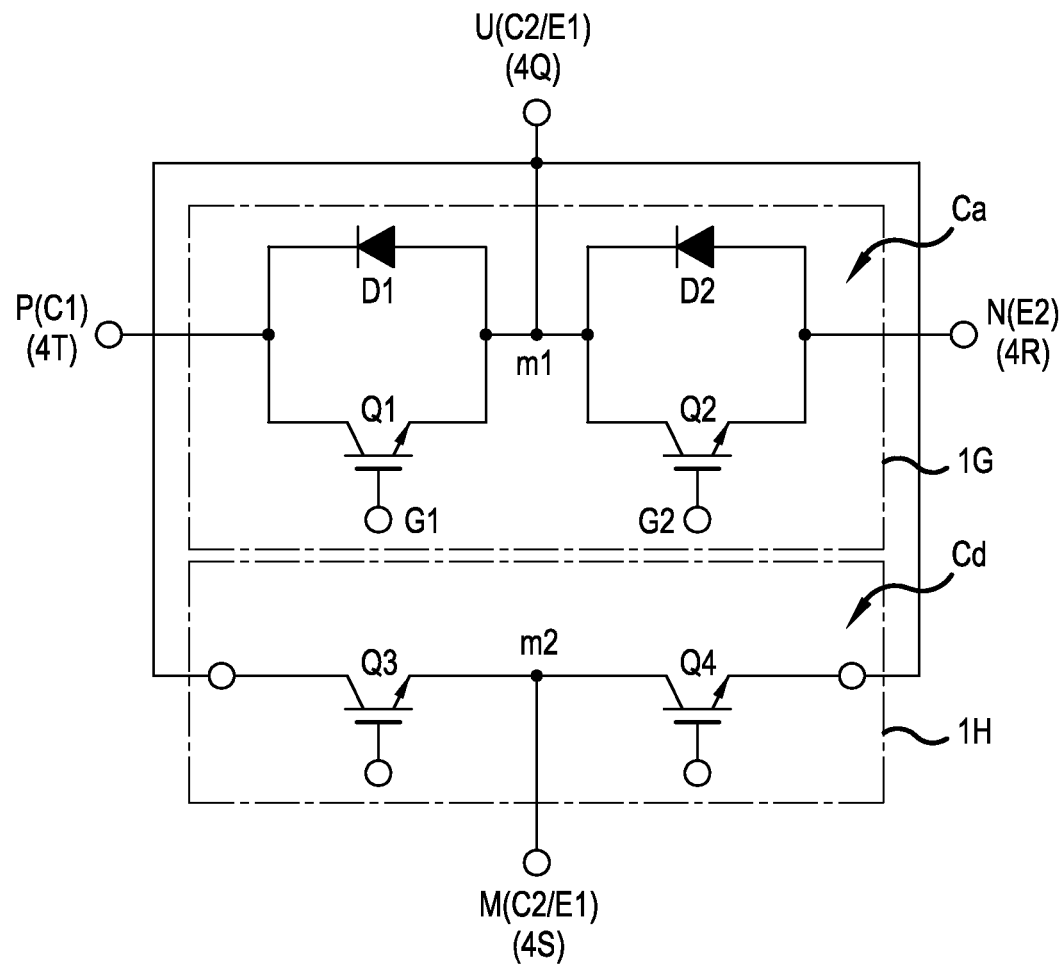
FIG. 18 is an equivalent circuit diagram illustrating a semiconductor circuit formed by the composite module illustrated in FIG. 16.

The equivalent circuit of the composite module illustrated in FIG. 16 will be described with reference to FIG. 18. FIG. 18 is an equivalent circuit diagram illustrating a semiconductor circuit formed by the composite module illustrated in FIG. 16.

In the semiconductor circuit formed by the power semiconductor module 1G illustrated in FIG. 16, an inverse parallel circuit of a transistor Q1 and a diode D1 and an inverse parallel circuit of a transistor Q2 and a diode D2 are connected in series to each other between a positive electrode terminal P(C1) and a negative electrode terminal N(E2). In a semiconductor circuit Ca formed by the power semiconductor module 1G, an output terminal U is drawn from an intermediate point m1 between the inverse parallel circuits which are connected in series to each other.

In the power semiconductor module 1H, transistors (reverse blocking IGBTs) Q3 and Q4 are connected in series to each other to form a semiconductor circuit Cd. An intermediate terminal M is drawn from an intermediate point m2 between the transistors Q3 and Q4 which are connected in series to each other in the semiconductor circuit Cd.

Both ends of the series circuit of the transistors Q3 and Q4 in the semiconductor circuit Cd are connected to the intermediate point m1 of the semiconductor circuit Ca formed by the power semiconductor module 1G and the output terminal U.

As such, the power semiconductor modules 1G and 1H having the same outward shape are connected as illustrated in FIGS. 16 and 17 to form the composite module which corresponds to one phase. In this way, it is possible to form a semiconductor device which can be applied to the three-level inverter disclosed in Patent Document 8.

The invention has been described above on the basis of Embodiments 1 to 6 illustrated in the drawings, but is not limited thereto. In particular, in the structure of the composite module according to the invention, it is possible to achieve a circuit with necessary current capacity only by sequentially preparing, for example, the protective cases 3 and 7 as the host structure. That is, in Embodiment 4, the protective cases 3 are integrated by the host protective case 7 to form the semiconductor circuit. However, elements can be recursively integrated by the host protective case to simply achieve a semiconductor circuit with high current capacity.

In addition, a desired circuit structure is obtained only by a combination of the connections of the terminals in the semiconductor module. Therefore, the invention is not limited only to the power inverter device formed by, for example, the power semiconductor module 1.

Only the principle of the invention has been described above. Various modifications and changes of the invention can be made by those skilled in the art and the invention is not limited to the above-mentioned detailed structures and applications. All of the corresponding modifications and equivalents are included in the scope of the invention defined by the appended claims and equivalents thereof.

The invention claimed is:

1. A semiconductor device comprising:
   at least two semiconductor modules, each of the at least two semiconductor modules comprising a circuit board and at least one semiconductor circuit disposed on the circuit board;
   a main terminal plate electrically connecting terminals of the semiconductor circuits of the at least two semiconductor modules and comprising a connection terminal portion; and
   a protective case accommodating a composite module comprising the main terminal plate and the at least two semiconductor modules and comprising an insertion hole through which the connection terminal portion extends,
   wherein each of the at least two semiconductor modules comprises a through hole, and
   wherein the protective case comprises openings respectively corresponding to the through holes of each of the at least two semiconductor modules.

2. The semiconductor device according to claim 1,
   wherein each of the at least two semiconductor modules comprises a plurality of pin terminals connected to the terminals of the semiconductor circuit,
   the main terminal plate is a conductive plate body disposed across each of the at least two semiconductor modules and comprises a plurality of through holes respectively receiving the pin terminals, the connection terminal portion comprises a rising piece comprising a bent portion of the plate body, and
the rising piece extends outside of the protective case through the insertion hole.

3. The semiconductor device according to claim 1,
wherein each of the at least two the semiconductor modules comprises a plurality of terminal plates connected to the terminals of the semiconductor circuit and comprising a fastening opening portion,
the main terminal plate is a conductive plate body disposed across each of the at least two semiconductor modules and comprises a plurality of bolt insertion holes through which the main terminal plate is fastened to the terminal plate via the fastening opening portion and the bolt insertion hole,
the connection terminal portion comprises a rising piece comprising a bent portion of the plate body, and
the rising piece extends outside of the protective case through the insertion hole.

4. The semiconductor device according to claim 1, further comprising a heat sink,
wherein the protective case comprises an opening, and
the heat sink is fixed to the protective case via the opening such that the at least two semiconductor modules physically contact the heat sink.

5. The semiconductor device according to claim 1,
wherein each of the at least two semiconductor modules comprise a metal plate thermally connected to the circuit board and exposed outside of the protective case.

6. The semiconductor device according to claim 1,
wherein the terminals of the semiconductor circuit and at least a portion of the main terminal plate comprise copper (Cu), aluminum (Al), silver (Ag), gold (Au), or alloys thereof.

7. The semiconductor device according to claim 1, further comprising:
a second main terminal plate connecting the main terminal plates and forming a conduction path between a plurality of the composite modules accommodated in the protective case; and
a host protective case accommodating at least two or more composite modules connected by the second main terminal plate.

8. The semiconductor device according to claim 1,
wherein the semiconductor circuit forms a half-bridge circuit comprising an IGBT and a free wheeling diode on the circuit board.

9. The semiconductor device according to claim 8,
wherein the composite module comprises three semiconductor modules,
a first terminal connected to one end of the half-bridge circuit, a second terminal connected to a midpoint of the half-bridge circuit, and a third terminal connected to the other end of the half-bridge circuit extend from the semiconductor modules,
a first main terminal plate having a first connection terminal portion electrically connects the first terminals of the three semiconductor modules,
a second main terminal plate having a second connection terminal portion electrically connects the third terminals of the three semiconductor modules, and
a third main terminal plate having a third connection terminal portion, a fourth main terminal plate having a fourth connection terminal portion, and a fifth main terminal plate having a fifth connection terminal portion are connected to the second terminals.

10. The semiconductor device according to claim 9,
wherein the third, fourth, and fifth connection terminal portions are arranged in a straight line.

11. The semiconductor device according to claim 8,
wherein the composite module comprises three semiconductor modules,
a first terminal connected to one end of the half-bridge circuit, a second terminal connected to a midpoint of the half-bridge circuit, and a third terminal connected to the other end of the half-bridge circuit extend from the semiconductor modules,
a first main terminal plate having a first connection terminal portion is connected to the first terminal of one of the three semiconductor modules,
a second main terminal plate having a second connection terminal portion is connected to the third terminal of the one semiconductor module,
a third main terminal plate having a third connection terminal portion is connected between the second terminal of the one semiconductor module and a second terminal of another semiconductor module,
a fourth main terminal plate having a fourth connection terminal portion is connected to the second terminal of the other semiconductor module,
a fifth main terminal plate connects the other two first terminals, and
a sixth main terminal plate connects the other two third terminals.

12. The semiconductor device according to claim 1,
wherein the composite module comprises a first semiconductor module in which a half-bridge circuit formed by an IGBT and a free wheeling diode is formed as the semiconductor circuit on the circuit board and a second semiconductor module in which a series circuit of reverse blocking IGBTs is formed as the semiconductor circuit on the circuit board,
a first terminal connected to one end of the half-bridge circuit, a second terminal connected to a midpoint of the half-bridge circuit, and a third terminal connected to the other end of the half-bridge circuit extend from the first semiconductor module,
a first terminal connected to one end of the series circuit, a second terminal connected to a midpoint of the series circuit, and a third terminal connected to the other end of the series circuit extend from the second semiconductor module,
a first main terminal plate having a first connection terminal portion is connected to the first terminal of the first semiconductor module and the first and third terminals of the second semiconductor module,
a second main terminal plate having a second connection terminal portion is connected to the third terminal of the first semiconductor module,
a third main terminal plate having a third connection terminal portion is connected to the second terminal of the second semiconductor module, and
a fourth main terminal plate having a fourth connection terminal portion is connected to the third terminal of the first semiconductor module.

13. The semiconductor device according to claim 1, further comprising a heat sink, the protective case and each of the at least two semiconductor modules being coupled to the heat sink via fasteners respectively extending through the corresponding openings and through holes.

* * * * *